United States Patent
Shibata et al.

(10) Patent No.: US 6,556,103 B2
(45) Date of Patent: Apr. 29, 2003

(54) PIEZOELECTRIC RESONATOR WITH ELECTRODE RADIUS RELATED TO RESONATOR THICKNESS AND VIBRATION MODE, AND FILTER USING THE SAME

(75) Inventors: Akihiko Shibata, Yokosuka (JP); Masaki Takeuchi, Shiga-ken (JP); Noromitsu Tsukai, Yokaichi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/888,815

(22) Filed: Jun. 25, 2001

(65) Prior Publication Data

US 2001/0054941 A1 Dec. 27, 2001

(30) Foreign Application Priority Data

Jun. 23, 2000 (JP) ......................................... 2000-189125
Aug. 31, 2000 (JP) ......................................... 2000-262838
Dec. 6, 2000 (JP) ......................................... 2000-371135

(51) Int. Cl.$^7$ ........................... H03H 9/54; H03H 9/15; H03H 9/205
(52) U.S. Cl. ........................ 333/187; 333/189; 333/191; 310/324; 310/346
(58) Field of Search .................. 333/186–192; 310/324, 346, 349, 353

(56) References Cited

U.S. PATENT DOCUMENTS

| | | | | |
|---|---|---|---|---|
| 3,222,622 A | * | 12/1965 | Curran et al. | 333/192 |
| 4,456,850 A | | 6/1984 | Inoue et al. | 310/324 |
| 4,556,812 A | * | 12/1985 | Kline et al. | 310/324 |
| 4,642,508 A | | 2/1987 | Suzuki et al. | 310/321 |
| 4,719,383 A | * | 1/1988 | Wang et al. | 310/324 |
| 5,231,327 A | * | 7/1993 | Ketchum | 333/189 X |
| 5,382,930 A | | 1/1995 | Stokes et al. | 333/191 |
| 5,696,423 A | * | 12/1997 | Dydyk et al. | 310/346 |
| 5,789,845 A | * | 8/1998 | Wadaka et al. | 310/334 |
| 5,801,069 A | * | 9/1998 | Harada et al. | 438/52 |
| 6,016,025 A | * | 1/2000 | Wold et al. | 310/369 |
| 6,133,673 A | * | 10/2000 | Kawara et al. | 310/320 |

FOREIGN PATENT DOCUMENTS

EP 0 680 142 A1 11/1995

\* cited by examiner

Primary Examiner—Barbara Summons
(74) Attorney, Agent, or Firm—Keating & Bennett, llp

(57) ABSTRACT

A piezoelectric resonator using an $n^{th}$-order mode of a thickness longitudinal vibration or a thickness-shear vibration includes a vibrating section having a piezoelectric layer, a pair of electrodes and a support member for holding the vibrating section. The pair of electrodes are provided on opposite sides of the piezoelectric layer, respectively, and the pair of electrodes partially overlap with each other via the piezoelectric layer to define an opposite electrode portion. The support member holds the vibrating section such that the vibrating section vibrates under an $n^{th}$-order mode of a thickness longitudinal vibration or a thickness-shear vibration. The opposite electrode portion preferably has a substantially circular shape having a radius r or is a polygonal shape circumscribing the substantially circular shape. The radius r satisfies the inequality $20t/n \leq r$, where t is a thickness of the vibrating section.

20 Claims, 28 Drawing Sheets

PIEZOELECTRIC RESONATOR WITH ELECTRODE RADIUS RELATED TO RESONATOR THICKNESS AND VIBRATION MODE, AND FILTER USING THE SAME

BACKGROUND OF THE INVENTION

1. Field of the Invention

The present invention relates to a piezoelectric resonator and a piezoelectric filter including the same, and more particularly, for example, to a piezoelectric resonator that generates a thickness longitudinal vibration or a thickness-shear vibration and to a piezoelectric filter including a plurality of piezoelectric resonators.

2. Description of the Related Art

As a piezoelectric resonator using a thickness longitudinal vibration fundamental wave, for example, a piezoelectric resonator shown in FIGS. 1A and 1B has been reported (K. NAKAMURA, H. SASAKI, H. SHIMIZU: Faculty of Engineering, Tohoku University "ZnO/SiO$_2$-DIAPHRAGM COMPOSITE RESONATOR ON A SILICON WAFER", ELECTRONICS LETTERS, Jul. 9th, 1981, Vol.17, No.14). In this piezoelectric resonator 1, an SiO$_2$ layer having a thickness of 2.5 μm defines a dielectric layer 2, and a ZnO layer having a thickness of 4.5 μm defines a piezoelectric layer 3. Then, on both surfaces of the piezoelectric layer 3, a pair of opposing electrode layers 4a and 4b are disposed. The portion where the electrode layers 4a and 4b oppose each other has a rectangular planar shape having dimensions of 350 μm×140 μm.

The resonance characteristic of such a piezoelectric resonator 1 is shown in FIG. 2. In FIG. 2, the largest response is the resonance of a longitudinal vibration fundamental wave, which is called an S$_0$ mode and is a desired resonance (main vibration). Small responses are generated at the high-frequency side of this main vibration, and are called S$_1$, S$_2$, S$_3$, . . . mode in order of closeness to the main vibration. These modes are resonances (spurious vibrations) that, preferably, should not exist in the characteristic. The nature of these spurious vibrations is such that the states change according to the diameters of the electrodes, and as the diameters of the electrodes become large, the responses become large, and the responses come close to the main vibration. Accordingly, conventionally, in order to prevent the influence of the spurious vibrations, the radius of the electrodes is decreased enough to isolate the spurious vibrations from the main vibration, and the responses thereof are decreased.

However, the diameters of the electrodes affect not only the spurious vibrations but also the main vibration. When the diameters of the electrodes are small, since the area of the electrodes is decreased, the impedance of the resonator is increased, and the response of the main vibration is decreased. As described above, the spurious vibrations of the resonator and the impedance have a trade-off relationship. Therefore, the problem is that, if one of the spurious vibrations and the impedance is improved, the other is worsened.

For example, if the diameters of the electrodes is decreased until the spurious vibrations are small enough to use the resonator for an oscillator, the spurious vibrations disappear, and although the oscillation frequency may not move to the spurious vibrations for some reason, an increase in impedance of the resonator does not cause oscillation. On the other hand, if the radius of the electrodes is increased to produce an impedance that allows for oscillation, the spurious vibrations move closer to the main vibration, since the response thereof becomes large, and a problem occurs that the spurious vibrations oscillate and the oscillation frequency is not stable.

Also, in a ladder-type filter in which such piezoelectric resonators are combined, in relation to the trade-off of the impedance and spurious vibrations, if the diameters of the electrodes are decreased to suppress the spurious vibrations, since the impedance of the resonator cannot be reduced enough and the response of the main vibrations cannot be increased, there is a problem in that the insertion loss becomes large with respect to the characteristic of the ladder-type filter and the pass-band cannot be widened. On the other hand, if the diameters of the electrodes are increased, the spurious vibrations approach the main vibrations and interfere therewith. Accordingly, in the ladder-type filter in which these piezoelectric resonators are combined, a problem occurs in that a large ripple is produced in the pass-band.

SUMMARY OF THE INVENTION

In order to solve the problems described above, preferred embodiments of the present invention provide a piezoelectric resonator which has a small impedance and is hardly affected by the spurious vibrations.

In addition, preferred embodiments of the present invention provide a piezoelectric filter in which a ripple that occurs due to the influence of the spurious vibrations of the piezoelectric resonator in a pass band is minimized, while the filter has a wide pass band.

According to a preferred embodiment of the present invention, a piezoelectric resonator using an $n^{th}$-order mode of a thickness longitudinal vibration or a thickness-shear vibration includes a vibrating section having a piezoelectric layer, a pair of electrodes and a support member for holding the vibrating section. The pair of electrodes are provided on opposite sides of the piezoelectric layer, respectively, and the pair of electrodes partially overlap with each other via the piezoelectric layer to define an opposite electrode portion. The support member holds the vibrating section such that the vibrating section vibrates in an $n^{th}$-order mode of a thickness longitudinal vibration or a thickness-shear vibration. The opposite electrode portion preferably has a substantially circular shape having a radius r or preferably has a polygonal shape that circumscribes the substantially circular shape, and the radius r satisfies the following inequality:

$$20t/n \leq r$$

where t is a thickness of the vibrating section.

A mechanical quality coefficient of the piezoelectric resonator is preferably about 1000 or more, and the radius r of substantially circular shape preferably satisfies the inequality $40t/n \leq r$. Alternatively, the mechanical quality coefficient of the piezoelectric resonator may be less than about 1000, and the radius r of the substantially circular shape satisfies the inequality $20t/n \leq r < 40$.

The vibrating section may further include a dielectric layer, and temperature coefficients of elastic constant of the piezoelectric layer and the dielectric layer may have polarities that are different from each other. Alternatively the vibrating section may include another piezoelectric layer, and temperature coefficients of elastic constant of the two piezoelectric layers may have different polarities from each other.

In a piezoelectric resonator in which opposing electrodes are disposed in a piezoelectric body, it is known that the smaller r/t is, the farther the main vibration moves away from the spurious vibration, and the larger the ratio r/t is, the more the spurious vibration comes closer to the main vibration, wherein the radius of a substantially circular electrode is r, the thickness of a vibrating section is t. Conventionally, the spurious vibrations are kept away from the spurious vibration by decreasing the diameter of the electrode. In the present invention, the spurious vibrations are concentrated around the main vibration by increasing the diameter of the electrode enough in order to surely resonate in the frequency of the main vibrations.

The impedance can be minimized and made to be very small by increasing the diameter of the electrode. Furthermore, since the spurious vibrations concentrate around the main vibration, the resonator can surely resonate in the frequency of the main vibration. To obtain this effect, the radius r of the electrode is preferably within the range of $r \geq 20t/n$, wherein the thickness of the vibrating section is t and when an nth-order mode is used.

Regarding the range of the radius r of the electrode, especially when a mechanical quality coefficient Qm is about 1000 or more, it is $r \geq 40t/n$, and when the mechanical quality coefficient Qm is less than about 1000, it is $r \geq 20t/n$.

When the vibration section includes a composite structure of the piezoelectric body and the dielectric body or a composite structure of a plurality of piezoelectric bodies, in the relationship between one of the layers and the other layers, if a temperature coefficient of elastic constant is an inverted sign, by an appropriate combination, a change in frequency due to a change in temperature can be zero. Thus, a piezoelectric resonator that has a highly stable resonant frequency for the change in temperature and is hardly affected by the spurious vibration can be obtained.

When using a piezoelectric filter including a combination of a plurality of piezoelectric resonators, by using the piezoelectric resonators according to the above-described preferred embodiments of the present invention, a ripple generated in a pass band due to the spurious vibration can be suppressed. Also, by concentrating the spurious vibration of the piezoelectric resonator around the main vibration, these interfere with each other, and the difference Δf between the resonance frequency and the anti-resonant frequency is large, and a piezoelectric resonator having a wide pass band can be obtained.

Other features, elements, characteristics and advantages of the present invention will become more apparent from the following detailed description of preferred embodiments thereof with reference to the attached drawings.

For the purpose of illustrating the present invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1A:
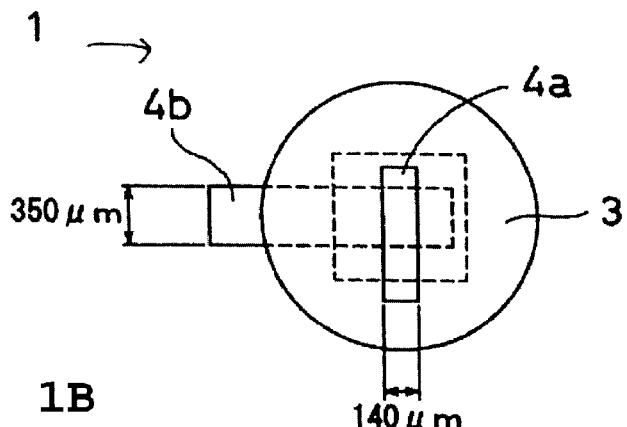
FIGS. 1A and 1B are schematic figures showing one example of a conventional piezoelectric resonator.
Figure 1B:
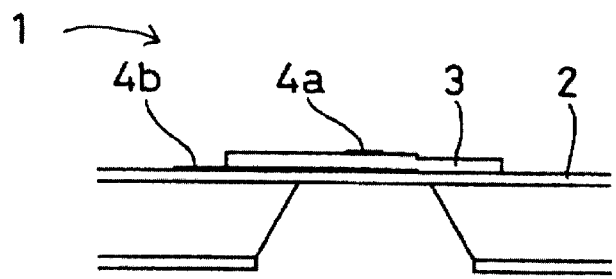
Figure 2:
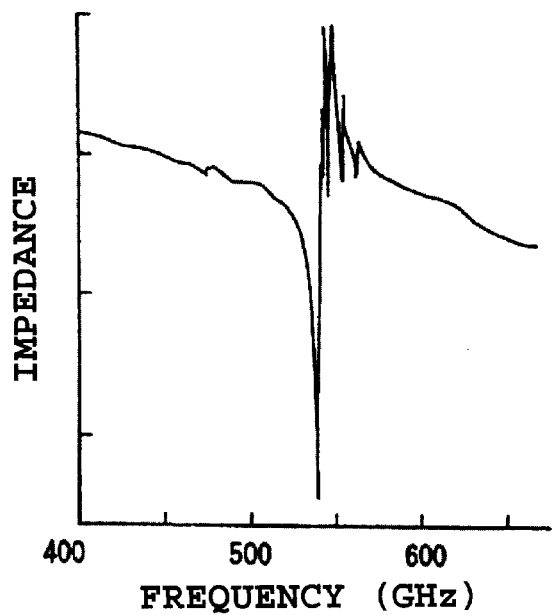
FIG. 2 is a characteristic view showing the resonance characteristic of the piezoelectric resonator shown in FIGS. 1A and 1B.
Figure 3:
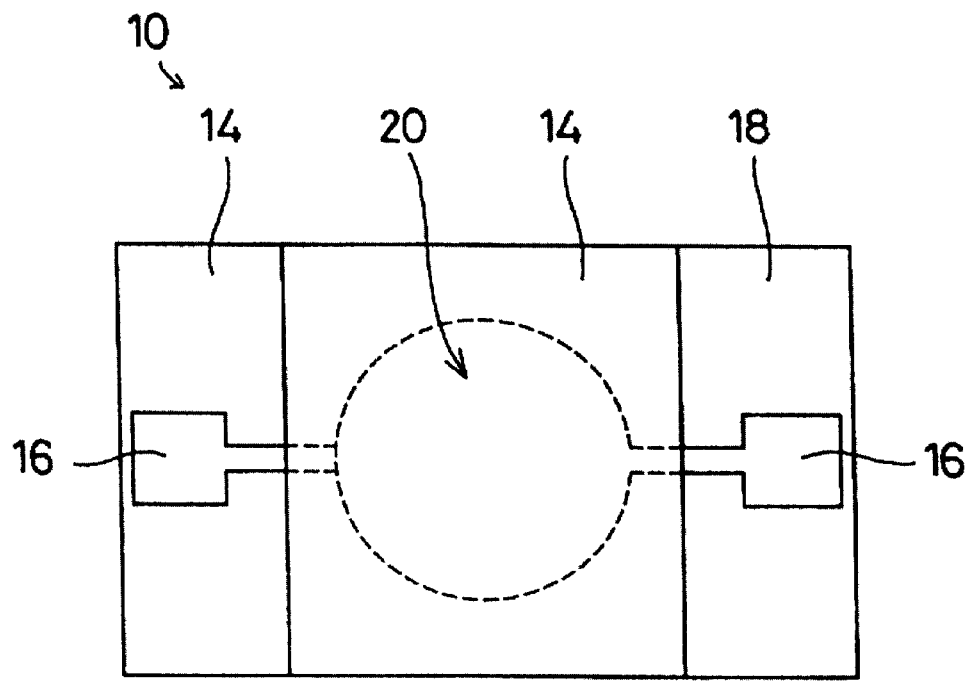
FIG. 3 is a plan view showing an example of a piezoelectric resonator according to a first preferred embodiment of the present invention.
Figure 4:
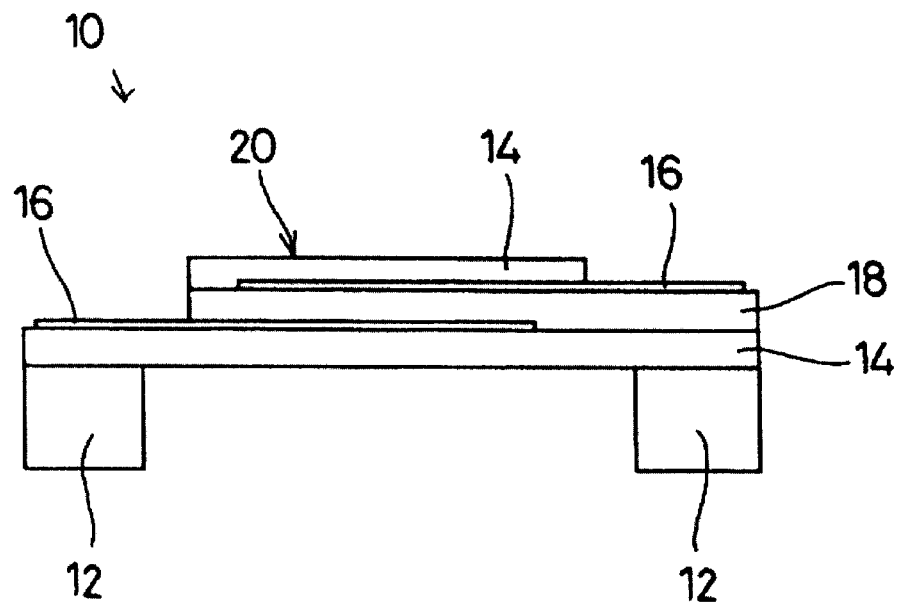
FIG. 4 is a schematic cross-sectional view of the piezoelectric resonator shown in FIG. 3.

FIG. 3 is a plan view showing an example of a piezoelectric resonator according to a preferred embodiment of the present invention, and FIG. 4 is a schematic cross-sectional view thereof. This piezoelectric resonator 10 preferably uses, for example, a fundamental wave (n=1) of a thickness longitudinal vibration with a frequency of about 100 MHz or more. The piezoelectric resonator 10 includes a substrate 12. The substrate 12 is preferably made of Si, Pyrex glass, or quartz, or other suitable material. A vibrating section 20 including a multi-layer structure of a piezoelectric thin film 18 having dielectric thin films 14 and electrode thin films 16 on both sides thereof is provided on the substrate 12. In this case, although $SiO_2$ is used to form the dielectric thin films 14, apart from $SiO_2$, for example, SiN or $Al_2O_3$ may be used. Furthermore, although Al is preferably used as the electrode thin films 16, apart from Al, for example, Au, Ag, or Cu may also be used. Furthermore, although ZnO is preferably used as the piezoelectric thin film 18, apart from ZnO, AlN or PZT may also be used. Meanwhile, in a portion on which the electrode thin film 18 is formed and which corresponds to the vibrating section 20, the substrate is removed by etching, laser processing or sandblasting so that the vibrating section 20 can vibrate.

Figure 5:
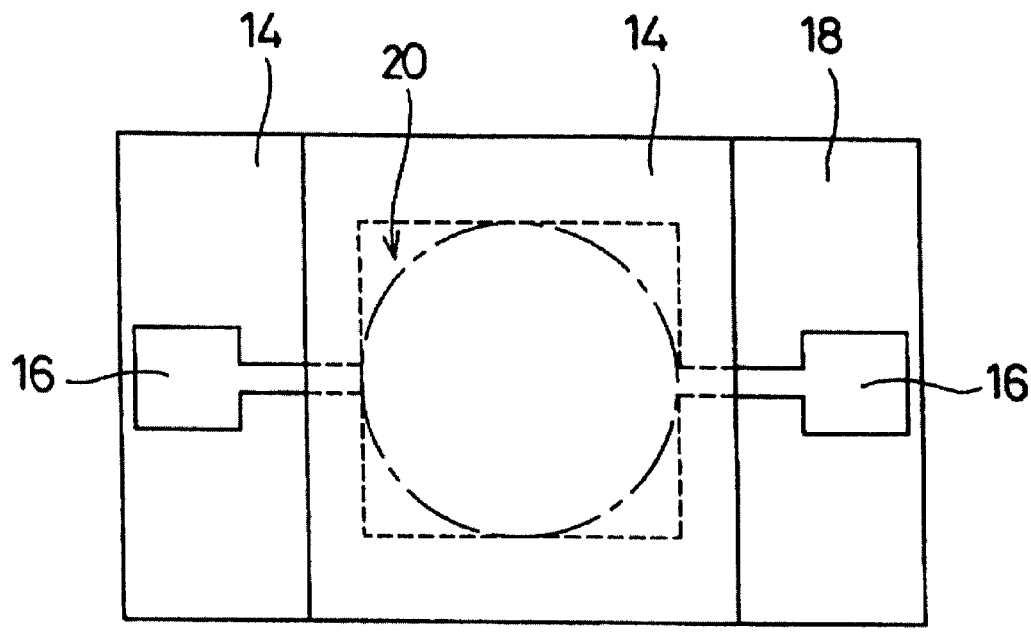
FIG. 5 is a plan view showing another example of the piezoelectric resonator according to the first preferred embodiment of the present invention.
Figure 6:
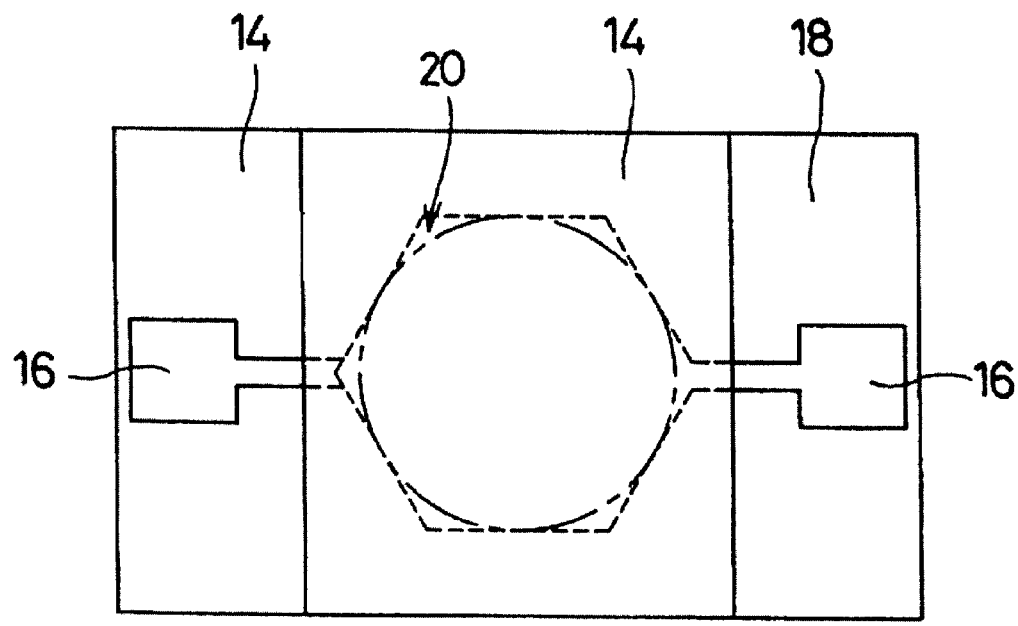
FIG. 6 is a plan view showing still another example of the piezoelectric-resonator according to the first preferred embodiment of the present invention.
Figure 7:
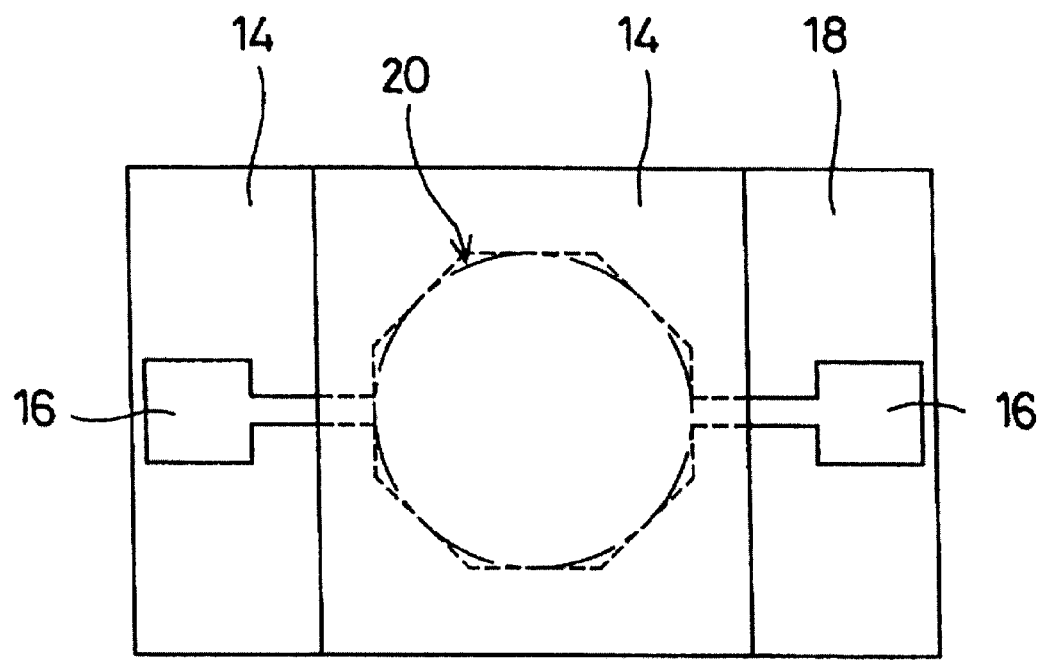
FIG. 7 is a plan view showing still another example of the piezoelectric resonator according to the first preferred embodiment of the present invention.

The shape of the opposite electrode portion defined by the electrode thin films 16 is preferably, for example, substantially circular. In this case, the vibrating section 20 is preferably constructed to have a thickness of about 2 μm, and the electrode thin films 16 are preferably constructed to have a radius of about 200 μm. In this way, the films are constructed so as to satisfy the condition r≧20t/n, wherein the thickness of the vibrating section 20 is t, and the radius of the electrode 16 is r. Especially, when the mechanical quality of coefficient Qm of the piezoelectric resonator 10 is approximately 1000 or more, it is preferable that the radius of the electrode 16 is within the range of r≧40t/n. Meanwhile, the shape of the electrode thin film is not limited to being substantially circular, and a polygon including a circle satisfying the above condition may be used, such as a square circumscribing a circle, as shown in FIG. 5, a hexagon circumscribing a circle, as shown in FIG. 6, or an octagon circumscribing a circle, as shown in FIG. 7. The two opposing electrode thin films 16 are preferably extended to opposite ends of the vibrating section 20.

Figure 8:
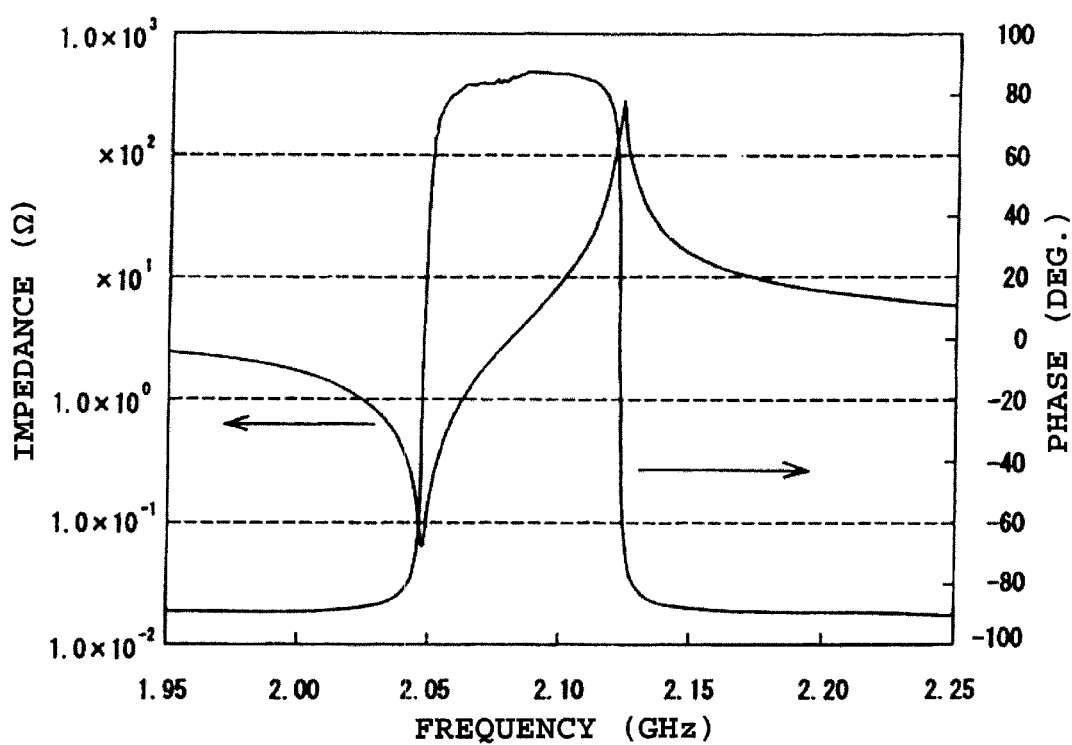
FIG. 8 is a characteristic view showing the resonant characteristic of the piezoelectric resonator shown in FIG. 3.
Figure 9:
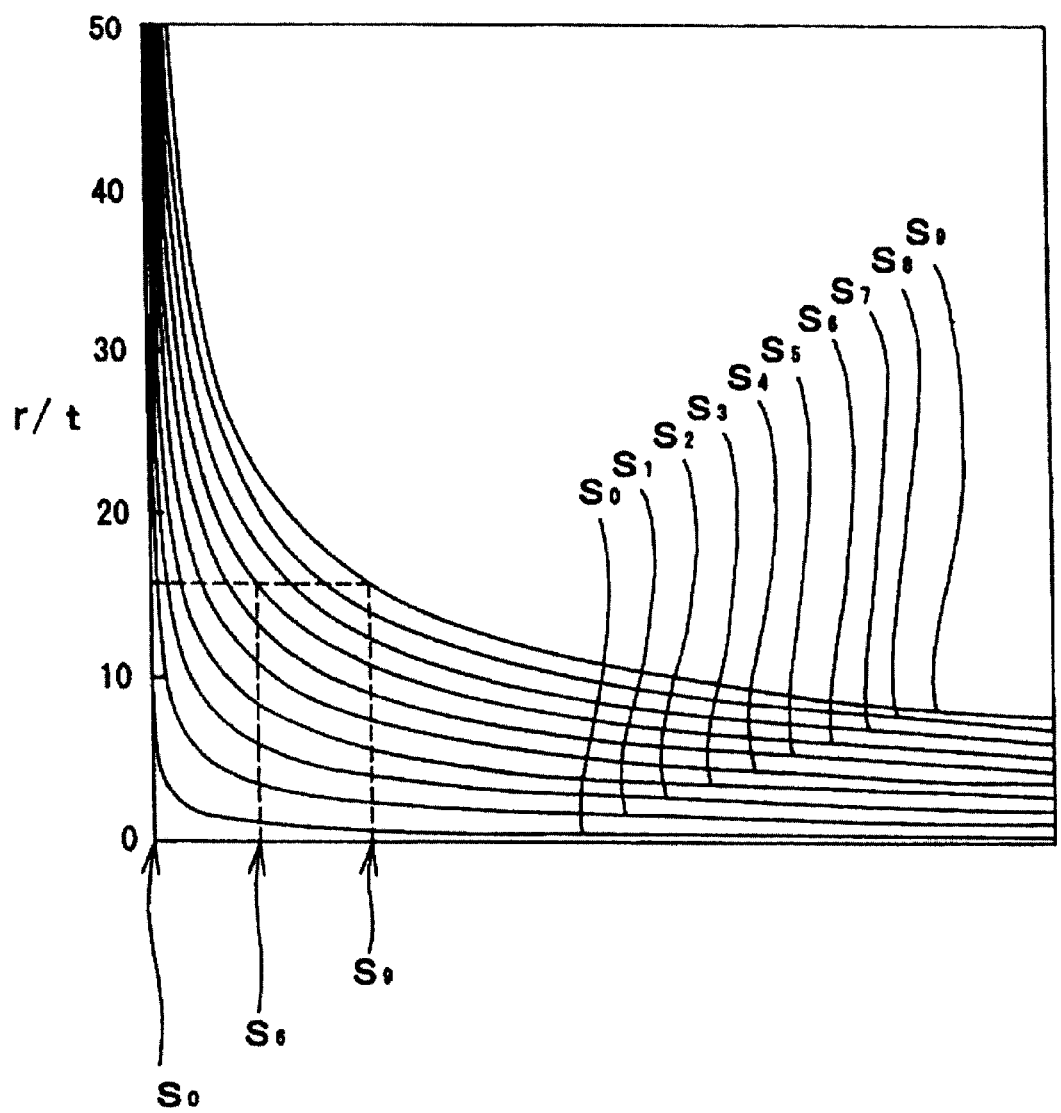
FIG. 9 is a characteristic view showing the relationship between a main vibration and spurious vibrations in the piezoelectric resonator.

The resonant characteristic of the piezoelectric resonator 10 described above is shown in FIG. 8. As can be seen from FIG. 8, in this piezoelectric resonator 10, a resonant characteristic without spurious vibrations behind the main vibration can be obtained. To describe the characteristic of the piezoelectric resonator 10, the relationship between the main vibration ($S_0$ mode) and the spurious vibrations ($S_1$ mode to $S_9$ mode) will be shown in FIG. 9. In FIG. 9, the horizontal axis denotes the resonance frequency and the vertical axis denotes the ratio r/t of the radius r of the electrode thin film 16 relative to the thickness t of the vibrating section 20. In FIG. 9, a line that is substantially parallel to the horizontal axis is drawn from the electrode radius, and a substantially perpendicular line is drawn from the intersection of the curve of each mode. In this case, the value at the intersection with the horizontal axis shows the resonant frequency in each mode.

In FIG. 9, if the radius r of the electrode is decreased, that is, the straight line drawn from the vertical axis is moved downward, the spurious vibrations move apart from the main vibrations. If the radius of the electrode is made decreased enough, it is seen that intersections with the curves showing respective spurious vibrations disappear. That is, the spurious vibrations are not generated. Conventionally, this characteristic is used to isolate or suppress the spurious vibrations.

Figure 10:
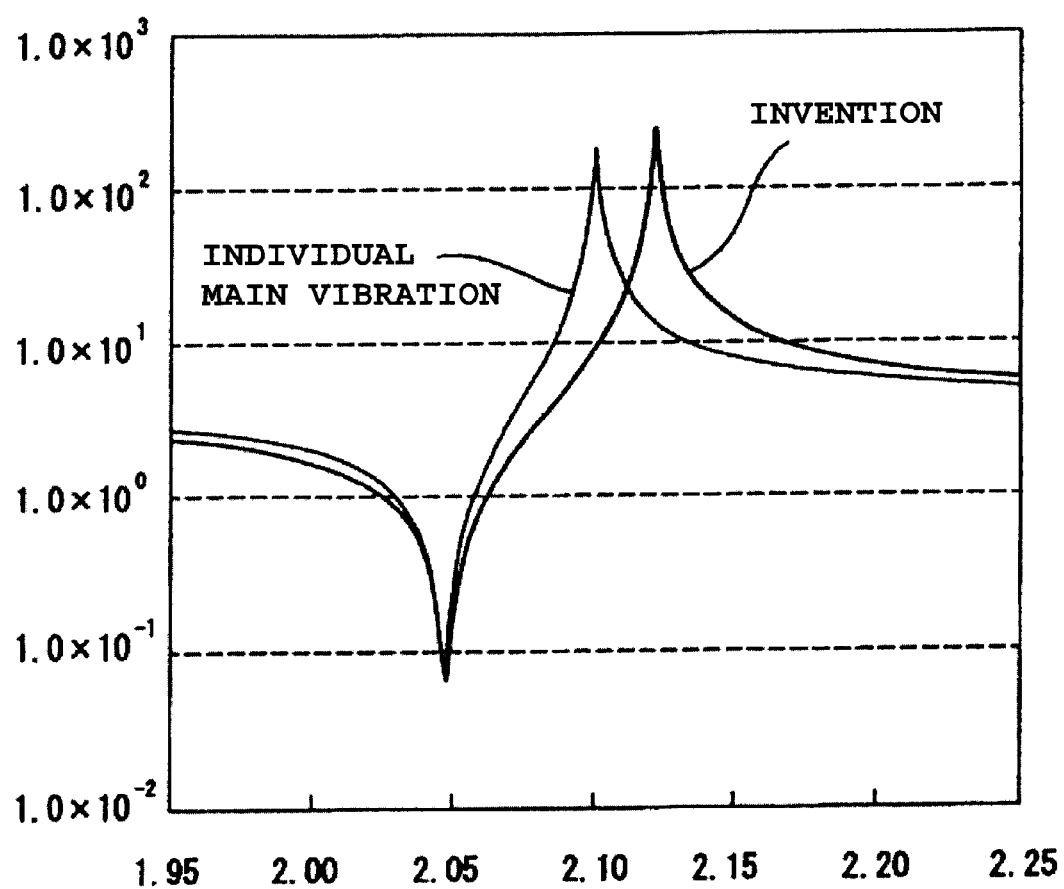
FIG. 10 is a characteristic view showing the resonant characteristic of the piezoelectric resonator according to preferred embodiments of the present invention and showing the characteristic of a piezoelectric resonator using only a main vibration.

On the other hand, if the radius r of the electrode is increased, that is, the straight line drawn from the vertical axis is moved upward, the spurious vibrations approach the main vibration. By utilizing this characteristic, the radius of the electrode is increased enough to concentrate the spurious vibrations around the main vibration. In this manner, the piezoelectric resonator 10 according to preferred embodiments of the present invention is produced. In this case, when the radius r of the electrode is not large enough, like the conventional piezoelectric resonator, the spurious vibrations are generated behind the main vibration, or the spurious vibrations overlap the main vibration to generate the deflected resonant characteristic. Analysis by a finite-element method and experiments show that the spurious vibrations concentrate around the main vibration when r/t is 20/n or more, and a good characteristic, as shown in FIG. 10, can be obtained. Especially, it is seen that in the case where the mechanical quality coefficient is about 1000 or more, when the ratio r/t is 40/n or more, an excellent characteristic can be obtained. To obtain an excellent characteristic, r/t is preferably large. Also, since the larger the radius of the electrode is, the more the impedance of the piezoelectric resonator 10 can be decreased, in the piezoelectric resonator according to this preferred embodiment of the present invention, an increase in impedance can be compatible with a decrease in influence of the spurious vibrations.

Also, by concentrating the spurious vibrations around the main vibrations, these interfere with each other, and an effect occurs in which the difference between the resonance frequency and the anti-resonance frequency is larger than in the case of using only the main vibration, as shown in FIG. 10. According to this characteristic, a filter with a wide pass band can be constructed by using the piezoelectric resonator 10 according to preferred embodiments of the present invention compared to a case of constructing a ladder-type filter by using a piezoelectric resonator in which only the main vibration vibrates with an electrode having a small radius.

Figure 11:
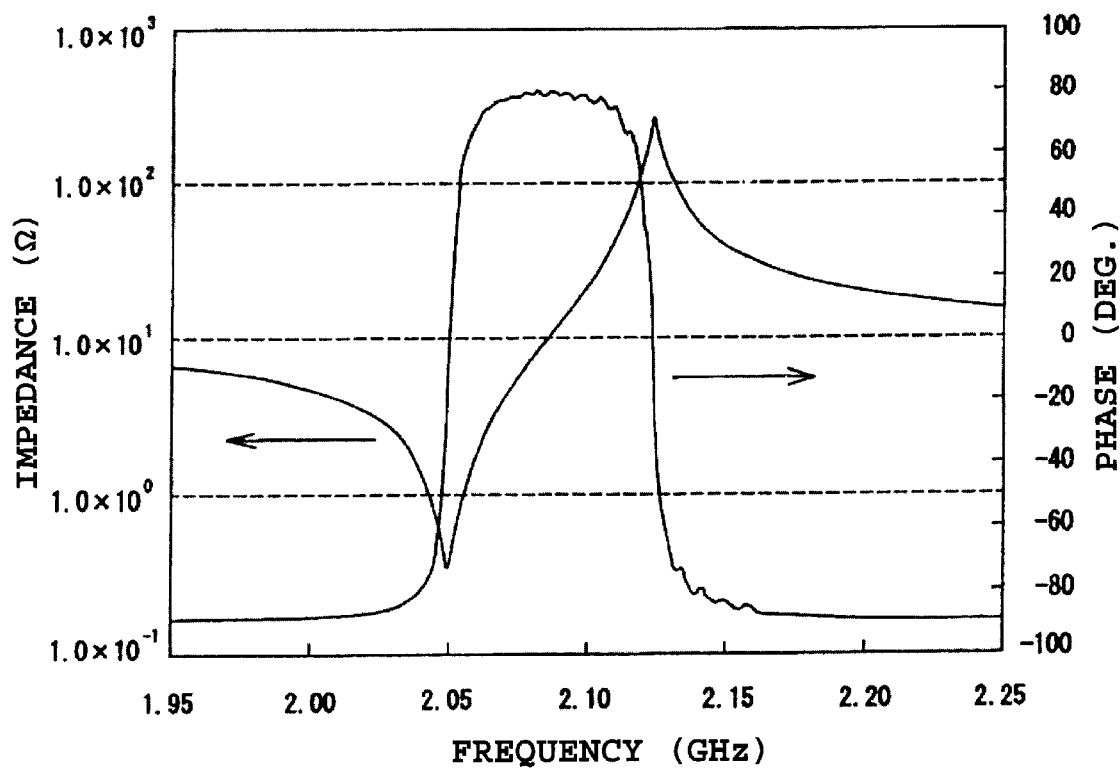
FIG. 11 is a characteristic view showing the characteristic of the piezoelectric when the mechanical quality coefficient Qm is about 500.

FIG. 11 shows the resonance characteristic of the piezoelectric resonator 10 having the same structure as that shown in FIG. 3 and FIG. 4, which is measured when the mechanical quality coefficient Qm is approximately 500 and the radius of the electrode r is modified to be about 115 $\mu$m. Meanwhile, the Qm value of the piezoelectric resonator can be controlled by changing the material or the ratio of combination of the thin film defining the vibrating section 20. In this piezoelectric resonator 10, compared to a piezoelectric resonator having a Qm value of about 1000 or more, even if the radius of the electrode is small, the effect of the spurious vibrations can be decreased.

The spurious vibrations have the tendency to move apart from the main vibration as the radius r of the electrode is decreased. Accordingly, when the radius of the electrode is small, a ripple is easily generated between the resonance section and the anti-resonance section. On the other hand, when the Qm value of the resonator is small, the mechanical vibration loss becomes large, and the response becomes small. Therefore, by reducing the Qm value of the resonator and by reducing the response of the spurious vibrations, the influence of the ripple is decreased, and an effect of reducing the influence of the spurious vibrations with the small radius of the electrode can be obtained. Analysis by a finite-element method and experiments show that the spurious vibrations concentrate around the main vibration when r/t is about 20/n or more, and an excellent characteristic, as shown in FIG. 11, can be obtained. Thus, a decrease in the Qm value is useful particularly in the case when a small piezoelectric resonator is required.

Also, in the piezoelectric resonator shown in FIG. 3 and FIG. 4, when the vibrating section 20 is constructed by a first layer including a piezoelectric body made of ZnO and a dielectric body made of $SiO_2$, and the thickness of the vibrating section, as a second layer structure, is about 2 $\mu$m and a ratio of film thickness ($SiO_2$ film thickness/ZnO film thickness) is about 0.53, a resonator having a resonance frequency temperature coefficient (TCF: Temperature Coefficient of Frequency) of zero can be obtained. Thus, a piezoelectric resonator having a resonance frequency that does not change with changes in temperature is provided.

Figure 12:
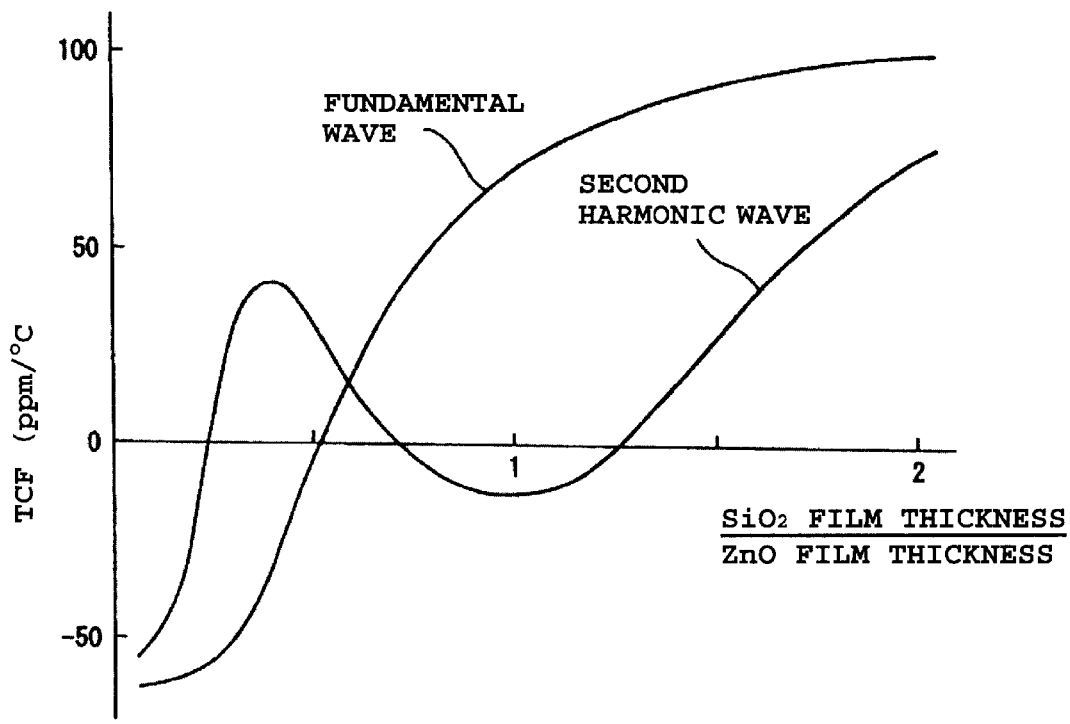
FIG. 12 is a figure showing the relationship between the film thickness and TCF in a fundamental wave and a double wave of a thickness longitudinal vibration resonator including two layers of ZnO and $SiO_2$.

FIG. 12 shows the relationship between the film thickness and TCF in a fundamental wave and a second harmonic wave of a thickness longitudinal vibration resonator including two layers of ZnO and $SiO_2$. The temperature coefficient of elastic constant of the $Sio_2$ has a positive value while a temperature coefficient of elastic constant of the ZnO has a negative value. Accordingly, by combining both at an appropriated ratio, as shown in FIG. 12, a piezoelectric resonator having a TCF of zero can be obtained.

Figure 13:
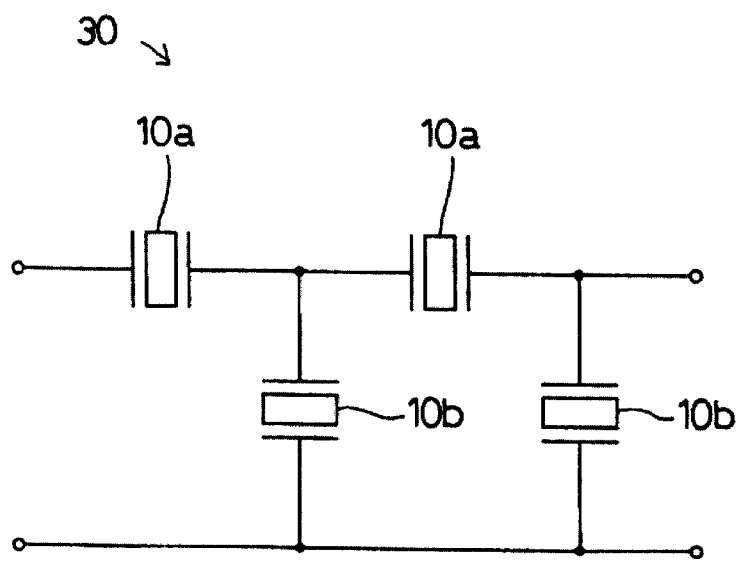
FIG. 13 is an equivalent circuit diagram showing a ladder-type filter in which the piezoelectric resonators according to preferred embodiments of the present invention are combined.
Figure 14:
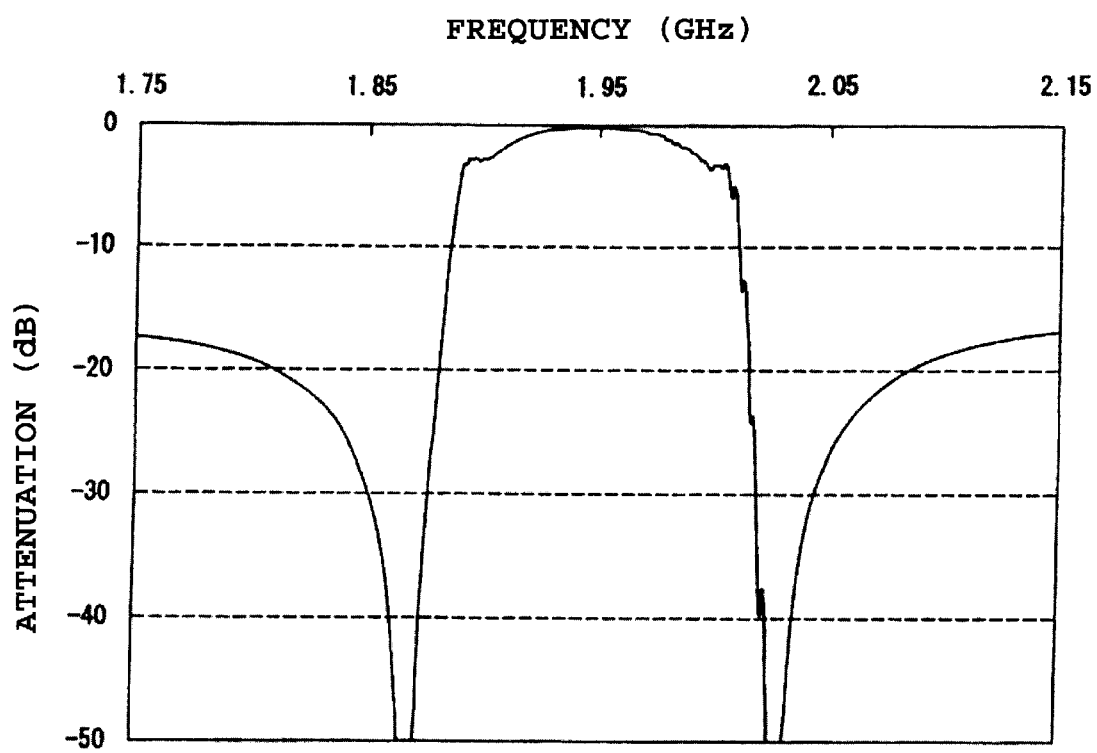
FIG. 14 is the pass-band characteristic of the ladder-type filter shown in FIG. 13.

Furthermore, as shown in FIG. 13, by using the piezoelectric resonator 10 according to preferred embodiments of the present invention, a ladder-type filter 30 can be obtained. In this case, an element having electrodes with a radius of about 150 $\mu$m and about 200 $\mu$m are prepared, and the piezoelectric resonator 10*a* having the electrode with the radius of about 150 $\mu$m is used in a series side and the piezoelectric resonator having the electrode with the radius of about 200 $\mu$m is used in a parallel side. At this time, the constructed thickness of each resonator is finely adjusted so that the resonance frequency of the resonator 10*a* in the series side corresponds to the anti-resonance frequency of the resonator 10*b* in the parallel side. This circuit is used as a band-pass filter, and a pass-band characteristic can be obtained.

In such a band-pass filter 30, when the conventional piezoelectric resonator is used, a large ripple is generated in a pass-band of the filter due to spurious vibrations generated in the high-frequency side from the main vibration of the resonator in the parallel side. On the contrary, by using the piezoelectric resonator 10 according to preferred embodiments of the present invention, the ripple in the pass-band can be suppressed.

Also, since the $\Delta$f of the resonator is widened compared to the conventional piezoelectric resonator, a filter having a wide pass-band can be obtained.

As explained above, according to the first preferred embodiment of the present invention, a piezoelectric resonator that has a small impedance and is hardly affected by the spurious vibrations can be obtained.

Furthermore, by decreasing the Qm of the resonator, a piezoelectric resonator having a significant spurious-suppressing-effect with a smaller electrode radius can be obtained, and a small piezoelectric resonator having low spurious vibrations can be obtained.

Furthermore, by allowing a piezoelectric body and a dielectric body to have a temperature coefficient of elastic constant with inverse signs to each other and by combining them at an appropriate ratio of film thicknesses, the TCF can be zero. Thus, a piezoelectric resonator having a stable resonance frequency with changes in temperature and minimized vibrations can be obtained.

Figure 15:
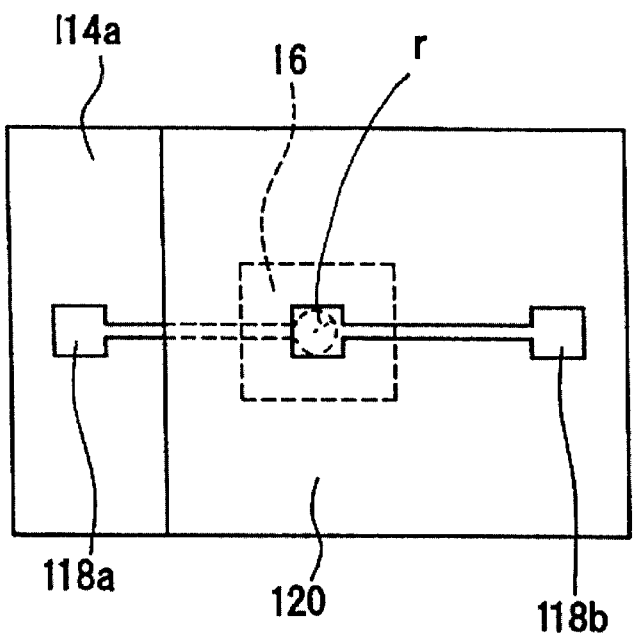
FIG. 15 is a schematic plan view showing one example of a piezoelectric resonator according to a second preferred embodiment of the present invention.
Figure 16:
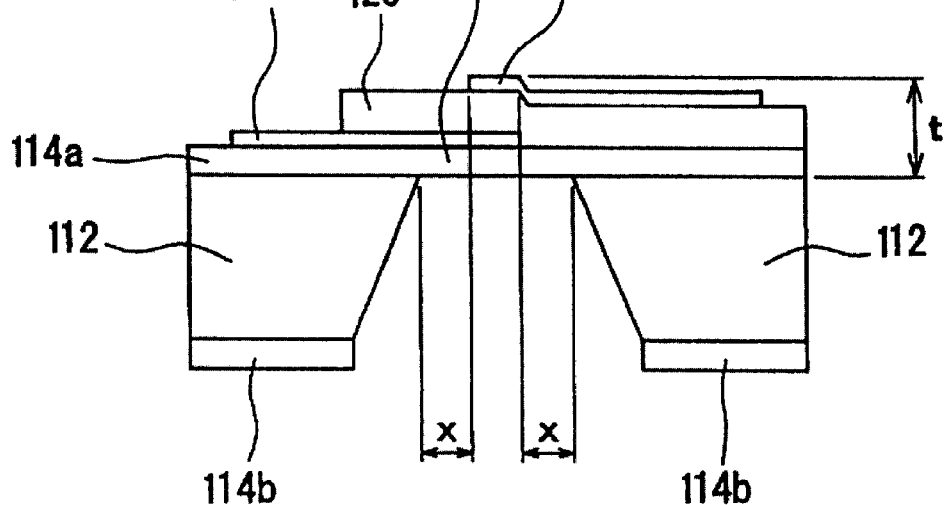
FIG. 16 is a schematic cross-sectional view of the piezoelectric resonator shown in FIG. 15.

FIG. 15 is a schematic plan view showing one example of a piezoelectric resonator according to a preferred embodiment of the present invention, and FIG. 16 is a schematic cross-sectional view of the piezoelectric resonator. This piezoelectric resonator 110 includes a {100} Si substrate 112. The {100} Si substrate 112 is used for supporting a diaphragm section 116 that defines a vibrating section, in the periphery.

On the top and bottom surface of the {100} Si substrate 112, for example, a dielectric layer 114*a* preferably made of $SiO_2$ and an $SiO_2$ film 114*b* are respectively formed by a sputtering method or a thermal oxidation method, or other suitable method.

On the approximate center of the {100} Si substrate 112, a diaphragm section 116 is defined by the dielectric layer 114*a*. In this case, for example, first, at the approximate center of the $Sio_2$ film 114*b* on the bottom surface of the {100} Si substrate 112, a window for anisotropic etching is patterned by RIE (Reactive Ion Etching) or wet etching.

Then, the {100} Si substrate 112 patterned with the window and so forth are dipped in an etching solution such as TMAH (Tetramethylammonium hydroxide), KOH (Kalium hydride) or EDP (Ethylenediamine pyrocatechol), the {100} Si substrate 112 is subjected to an anisotropic etching through the window. That is, the etching rate of the {100} surface of the {100} Si substrate differs from that of the {111} surface thereof. Consequently, the {100} surface is etched faster than the {111} surface, and in particular, as shown in FIG. 16, the approximate center of the {100} Si substrate 112 is etched so that inclined surfaces are formed, and the diaphragm section 116 is formed of the dielectric layer 114a.

On the dielectric layer 114a, a lower electrode 118a, a piezoelectric layer 120 and an upper layer 118b are formed in this order.

In this case, the lower electrode 118a is preferably made of a metal such as, for example, Au, Ag, or Al on the portion including the approximate center in the top surface of the dielectric layer 114a. Also, the piezoelectric layer 120 is preferably formed of a piezoelectric body such as, for example, ZnO or AlN on the top surfaces of the dielectric layer 114a and the lower electrode 118a, corresponding to the portion including the approximate center of the dielectric layer 114a. Furthermore, the upper electrode 118b is preferably made of a metal such as, for example, Au, Ag or Al on the top surface of the piezoelectric layer 120, corresponding to the portion including the approximate center of the dielectric layer 114a.

Also, in this case, the portion where the lower electrode 118a and upper electrode 118b oppose each other is constructed to be, for example, a square circumscribing a circle having a radius of about 20/n (n is the order of the vibration mode) or more times the thickness t (see FIG. 16) of the vibrating portion.

Furthermore, in this case, the opposite electrode portion is constructed so that the shortest distance x (see FIG. 16) from the end of the portion where the lower electrode 118a and the upper electrode 118b oppose to the end of the {100} Si substrate 112 satisfies $2t/n \leq x \leq 10t$.

In order to protect the piezoelectric layer 120 or to improve the resonance frequency temperature coefficient TFC (Temperature Coefficient of Frequency), a different dielectric layer made of, for example, $SiO_2$ may be formed on the upper electrode 118b as required (not shown in FIG. 15 and FIG. 16). In this case, the material or thickness of the different dielectric layer may be set in accordance with the required characteristic.

In this piezoelectric resonator 110, since the portion where the lower electrode 18a and upper electrode 118b oppose each other is constructed to be, for example, a shape circumscribing a circle having a radius of about 20/n times the thickness t (see FIG. 16) of the vibrating portion, very effective energy-trapping is performed, vibration leakage from the portion where the lower electrode 118a and the upper electrode 118b oppose to the portion where the lower electrode 118a to the upper electrode 118b do not oppose is decreased, and the amount of energy loss can be decreased. Also, by reducing the vibration leakage due to the reflection of vibrations, unwanted vibrations are suppressed.

Also, in this piezoelectric resonator 110, since the shortest distance x from an end of the portion where the lower electrode 118a and the upper electrode 118b oppose an end of the {100} Si substrate 112 is about 2t/n or more, the influence of the vibrations leaking from the portion where the lower electrode 118a and the upper electrode 118b oppose each other and vibrations reflected at the end of the {100} Si substrate 112 and returned to the portion where the lower electrode 118a and the upper electrode 118b oppose each other is small, and the unwanted vibrations due to the reflection of the vibrations are negligible.

Furthermore, in the piezoelectric resonator 110, since the shortest distance x from the end of the portion where the lower electrode 118a and the upper electrode 118b oppose each other to the end of the {100} Si substrate 112 is about 10t or less, deformation of the dielectric layer 114a due to stress of the diaphragm section 116 is minimized, the diaphragm section 116 is not damaged and the yield is greatly improved.

Figure 17:
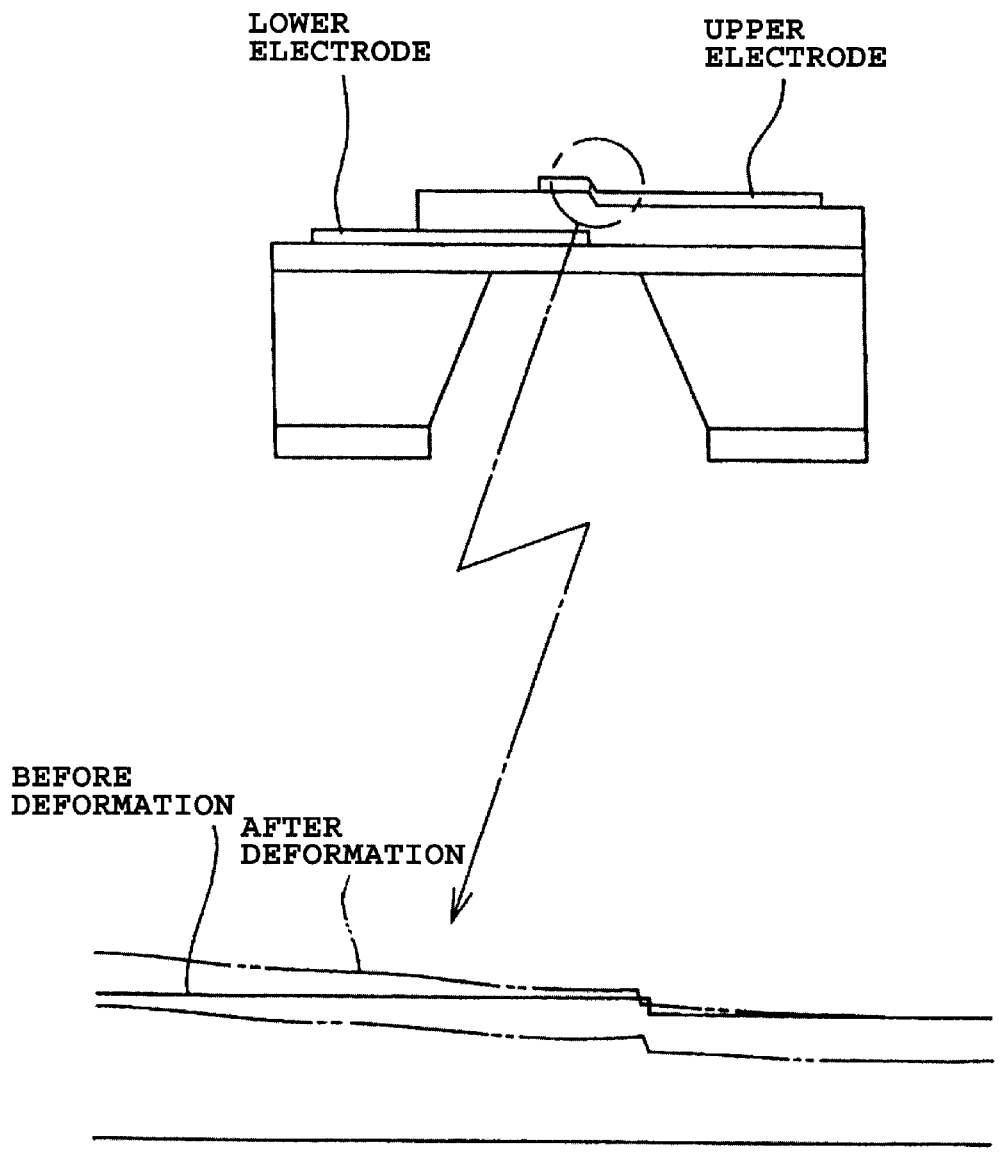
FIG. 17 is a schematic figure showing the result of analyzing, by a finite element method, the state of vibration around the upper electrode when the conditions of various preferred embodiments of the present invention are satisfied.
Figure 18:
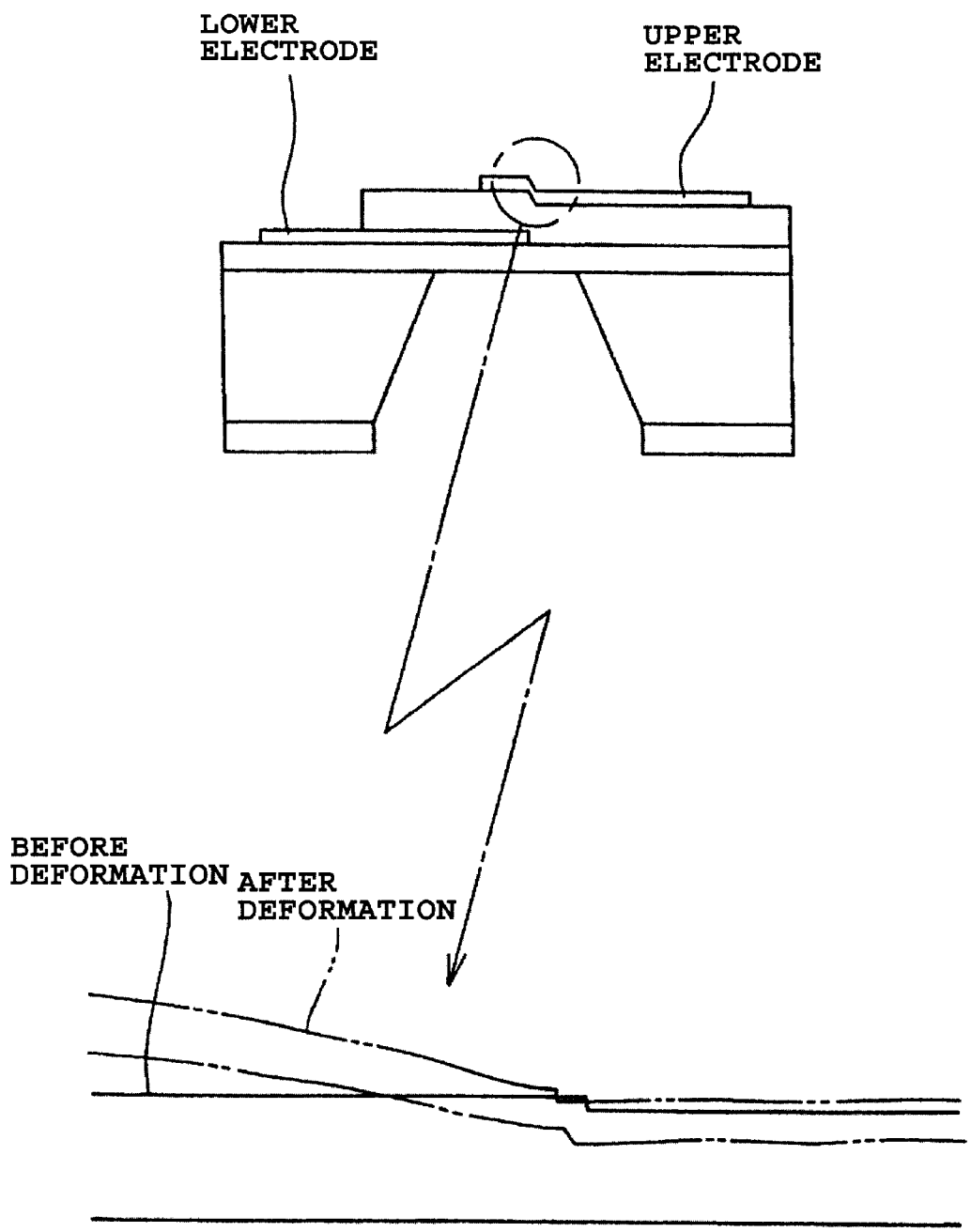
FIG. 18 is a schematic view showing the result of analyzing, by a finite element method, the state of vibration around the upper electrode when the conditions of the present invention are not satisfied.

FIG. 17 is a schematic view showing the result of analyzing, by finite element method, the state of vibrations around an end of the upper electrode when the conditions of various preferred embodiments of the present invention are satisfied. FIG. 18 is a schematic view showing the result of analyzing, by finite element method, the state of vibrations around an end of the upper electrode when the conditions of various preferred embodiments of the present invention are not satisfied.

As shown in FIG. 18, it is seen that, when the conditions of various preferred embodiments of the present invention are not satisfied, the portion where the lower electrode and the upper electrode do not oppose each other is also displaced and the vibrations leak.

On the other hand, as shown in FIG. 17, when the conditions of preferred embodiments of the present invention are satisfied, the vibrations that leaked in the portion where the lower electrode and the upper electrode oppose each other immediately converge, and excellent energy trapping is performed. In this way, since the leaked vibrations are decreased, reflection of the vibrations hardly occurs, and unwanted vibrations due to the reflection of the vibrations are minimized.

Figure 19:
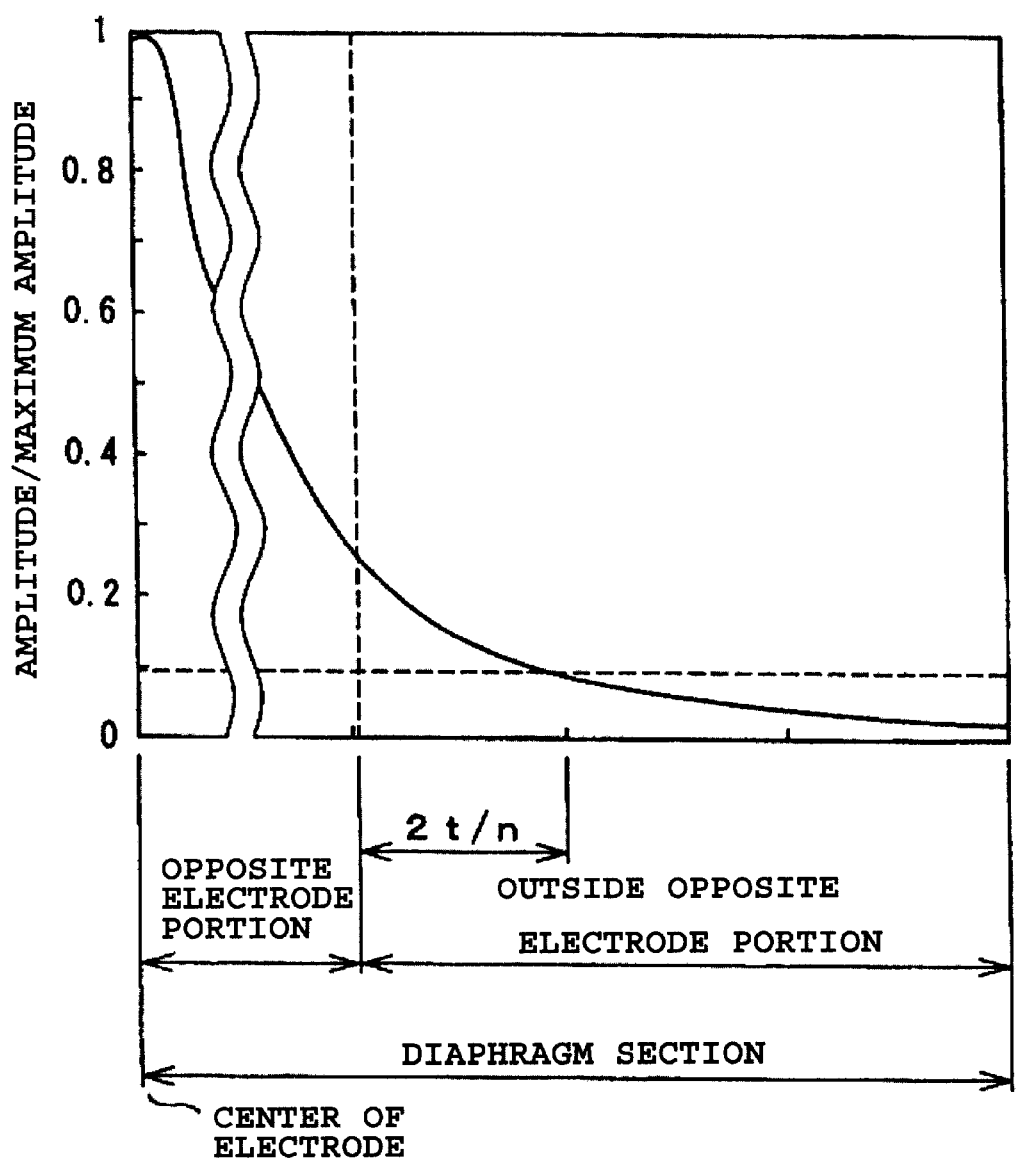
FIG. 19 is a graph showing the result of analysis of displacement distribution of the vibration in the diaphragm section by a finite element method.

FIG. 19 is a graph showing the result of analysis of displacement distribution of the vibrations in the diaphragm section by a finite element method. As shown by the graph in FIG. 19, it is seen that the displacement of vibrations in the portion where the lower electrode and the upper electrode do not oppose each other becomes small as the distance from the portion where the lower electrode and the upper electrode oppose each other increases, and is attenuated to about ten percent of the maximum amplitude at a distance of about 2t/n.

Furthermore, experiments show that, by allowing the shortest distance x from the end of the portion where the lower electrode and the upper electrode oppose each other to the end of the {100} Si substrate 112 to differ by about 2t/n or more, the unwanted vibrations due to the reflection of vibrations become small enough to be ignored.

Furthermore, the larger the distance x is, the more effective it is as a countermeasure against unwanted vibrations. However, when the distance x exceeds about 10t, the yield is drastically reduced. The reason is that improvement of the diaphragm section causes a large deformation due to the stress of the diaphragm section, and therefore, the diaphragm is easily broken.

Therefore, by setting the shortest distance x from the end of the portion where the lower electrode and the upper electrode oppose each other to the end of the {100} Si to about $2t/n \leq x \leq 10t$, unwanted vibrations due to the reflection from the end of the {100} Si substrate are small enough to be ignored, and an excellent yield is obtained.

In the above-explained piezoelectric resonator, it is possible to set the TCF at zero by adjusting thickness ratio of the dielectric layer 114a and the piezoelectric layer 120.

Figure 20:
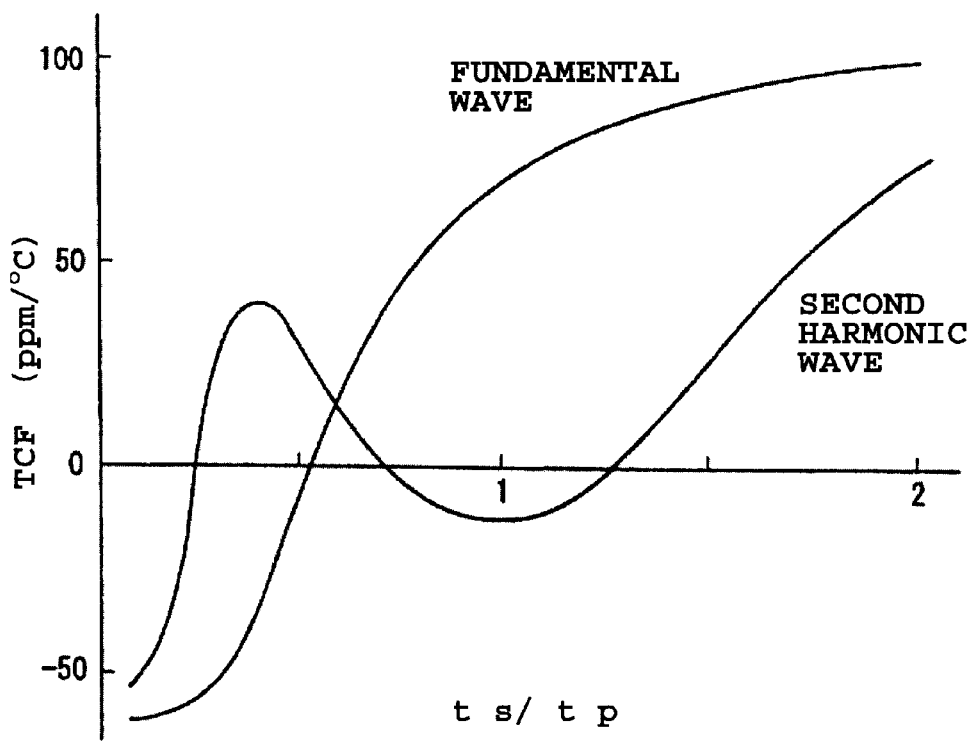
FIG. 20 is a graph showing the relationship between the ratio of film thickness ts/tp (film thickness of dielectric layer ($SiO_2$)/film thickness of piezoelectric layer (ZnO)) and a temperature coefficient of resonance frequency TCF, regarding a fundamental wave and a second harmonic wave of a thickness longitudinal vibration of a piezoelectric resonator having a two-layer structure of piezoelectric layer including ZnO and the dielectric layer including $SiO_2$.

FIG. 20 is a graph showing the relationship between a ratio of film thickness ts/tp (film thickness of dielectric layer ($SiO_2$)/film thickness of piezoelectric layer) and the temperature coefficient of resonance frequency TCF, regarding a fundamental wave and a second harmonic wave of a thickness longitudinal vibration of a piezoelectric resonator having a two-layer structure of the piezoelectric layer including ZnO and the dielectric layer including $SiO_2$.

The temperature coefficient of the elastic constant of the dielectric layer ($SiO_2$) has a positive value, while the temperature coefficient of the elastic constant of the piezoelectric layer (ZnO) has a negative value.

Accordingly, by combining the piezoelectric layer (ZnO) and the dielectric layer ($SiO_2$) at a suitable ratio of film thickness ts/tp, the resonance frequency temperature coefficient can become zero.

By doing this, a piezoelectric resonator having a resonance frequency that is stable with respect to temperature is provided.

Figure 21:
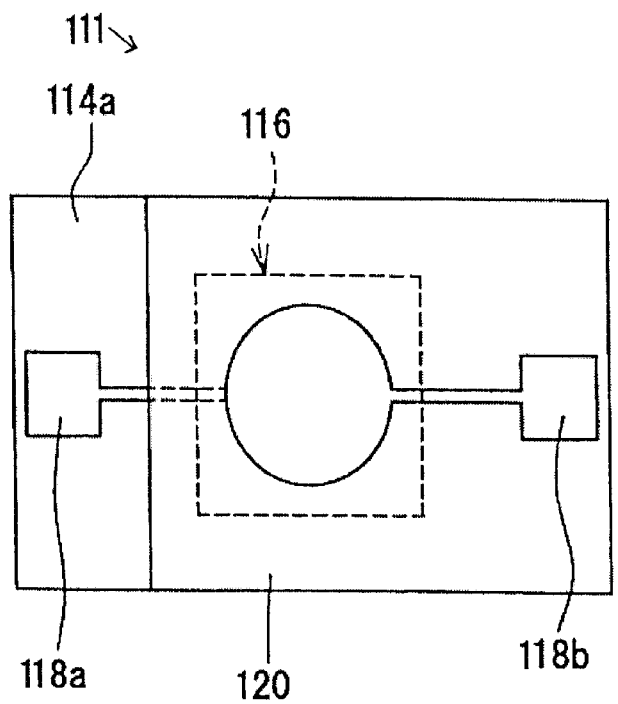
FIG. 21 is a schematic plan view showing another example of the piezoelectric resonator according to the second preferred embodiment of the present invention.

FIG. 21 is a schematic plan view showing a modified example of the piezoelectric resonator shown in FIG. 15. Compared to the piezoelectric resonator shown in FIG. 15, in the piezoelectric resonator 111 shown in FIG. 21, opposite electrode portions of a lower electrode 118a and an upper electrode 118b are respectively constructed to be substantially circular. The radius r of the substantially circular shape is about 20/n or more times the thickness t of the vibrating portion.

Figure 22:
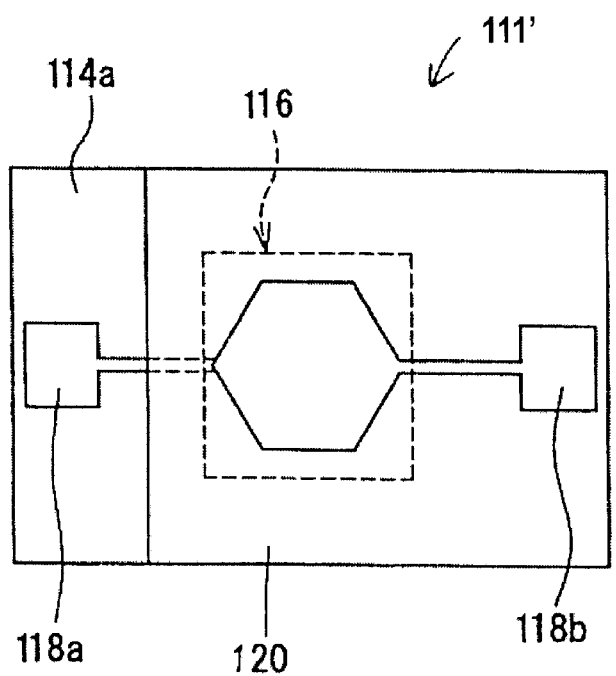
FIG. 22 is a schematic plan view showing still another example of the piezoelectric resonator according to the second preferred embodiment of the present invention.

FIG. 22 is a schematic plan view showing another modified example of the piezoelectric resonator shown in FIG. 15. In the piezoelectric resonator 111' shown in FIG. 22, compared to the piezoelectric resonator 110 shown in FIG. 15, the opposite portion in the lower electrode 118a and the upper electrode 118b are respectively constructed, for example, to be a hexagon including a circle having a radius of about 20/n times the thickness t of the portion where the lower electrode 118a and the upper electrode 118b oppose each other.

Figure 23:
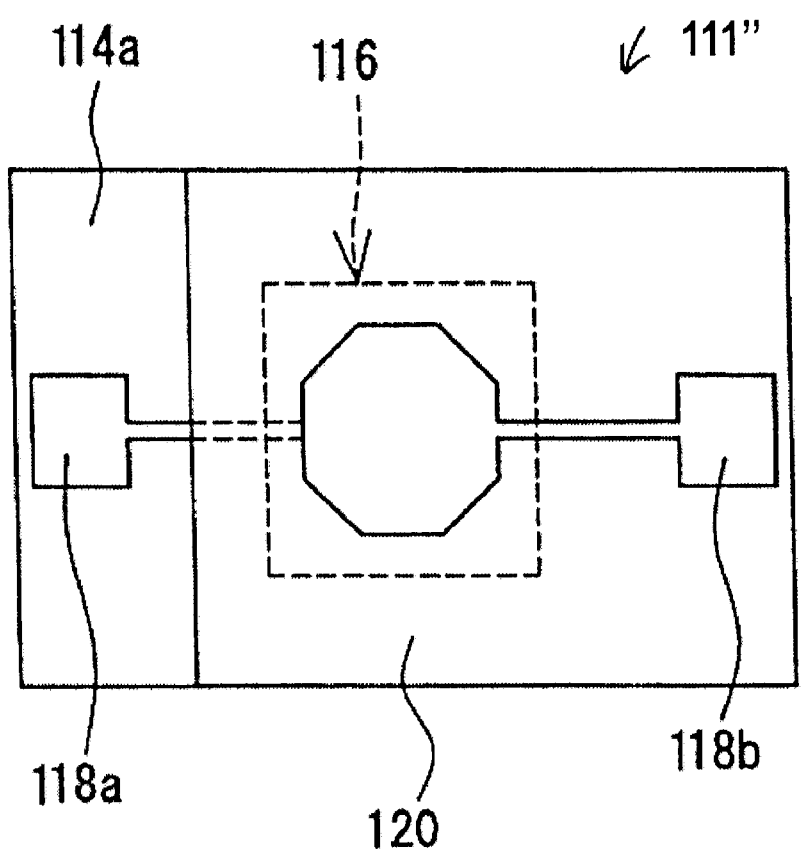
FIG. 23 is a schematic plan view showing still another example of the piezoelectric resonator according to the second preferred embodiment of the present invention.

FIG. 23 is a schematic plan view showing another modified example of the piezoelectric resonator shown in FIG. 15. In the piezoelectric resonator 111" shown in FIG. 23, compared to the piezoelectric resonator 110 shown in FIG. 15, the opposite electrode portions of the lower electrode 118a and the upper electrode 118b are respectively constructed to be an octagon circumscribing a circle having a radius of about 20/n or more times the thickness t of the portion where the lower electrode 118a and the upper electrode 118b oppose each other.

Also, in the piezoelectric resonator shown in FIG. 21 to FIG. 23, the shortest distance x from the portion where the lower electrode 118a and the upper electrode 118b oppose each other to the end of the {100} Si substrate 112 is preferably about $2t/n \leq x \leq 10t$.

Accordingly, the same effect obtained by the piezoelectric resonator 110 shown in FIG. 15 can also be obtained in the piezoelectric resonator shown in FIG. 21 to FIG. 23.

Meanwhile, in each piezoelectric resonator described above, the diaphragm section 116 may be formed by a vertical processing by RIE instead of an anisotropic etching of the substrate 112.

Also, the present invention is applicable to not only a piezoelectric resonator but also a piezoelectric filter including the piezoelectric resonator.

As explained above, according to the second preferred embodiment of the present invention, a piezoelectric resonator capable of canceling and preventing unwanted vibration and greatly improving the yield simultaneously can be obtained.

Also, according to various preferred embodiments of the present invention, a piezoelectric filter including the piezoelectric resonator that prevents undesired vibrations and greatly improves yield is provided.

Figure 24:
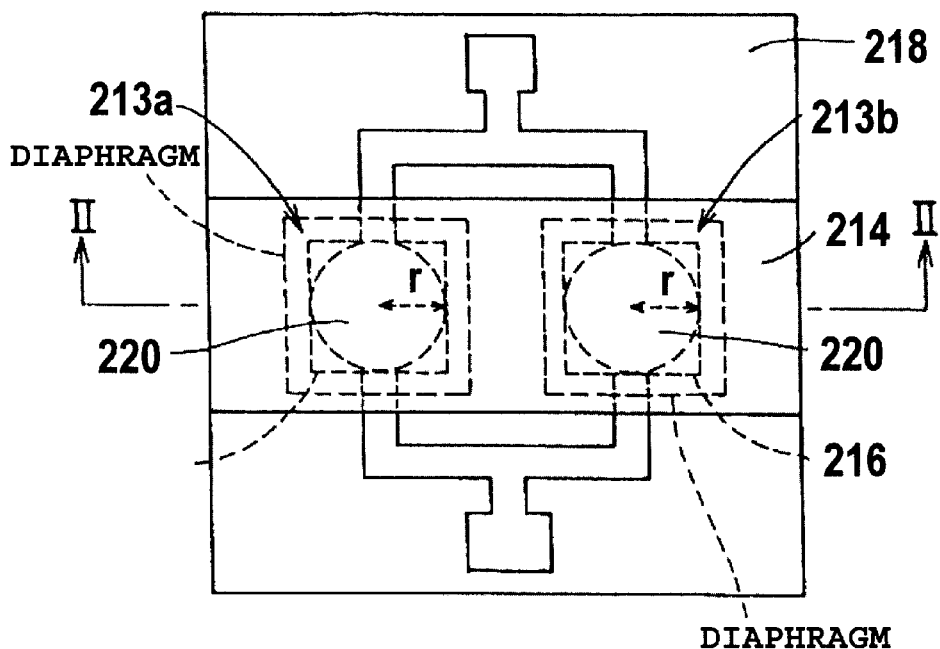
FIG. 24 is a schematic plan view showing one example of a piezoelectric resonator according to a third preferred embodiment of the present invention.
Figure 25:
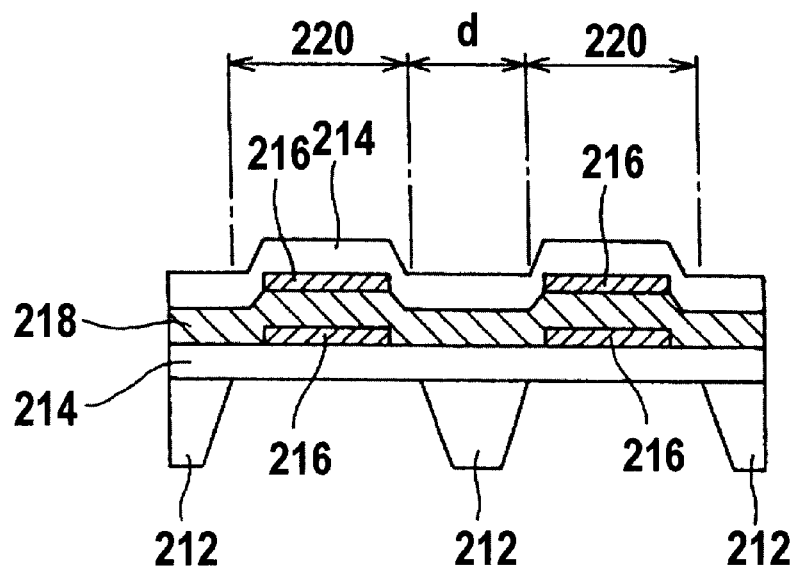
FIG. 25 is a schematic cross-sectional view of the piezoelectric resonator shown in FIG. 24.

FIG. 24 is a plan view showing one example of a piezoelectric resonator according to the third preferred embodiment of the present invention, and FIG. 25 is a schematic cross-sectional view thereof. This piezoelectric resonator 210 preferably uses a fundamental wave (n=1) of a thickness longitudinal vibration having a resonance frequency of about 2 GHz. The piezoelectric resonator 210 includes a substrate 212. The substrate 212 is preferably formed of {100} Si. Two resonators 213a and 213b are electrically connected in parallel on the substrate 212. The individual resonators 213a and 213b each includes the vibrating section 220. This vibrating section 220 is preferably constructed by laminating a dielectric thin film 214, an electrode thin film 216, a piezoelectric thin film 218, an electrode thin film 216 and a dielectric thin film 214 on the substrate 212 in this order. In this preferred embodiment, the dielectric thin films 214 are preferably formed of $SiO_2$, the electrode thin films 216 are preferably formed of Al, and the piezoelectric thin film 218 is preferably formed of ZnO. The thickness of each film is preferably as follows: $SiO_2$/Al/ZnO/Al/$SiO_2$=0.3/0.1/1.1/0.1/0.3 (unit: $\mu$m). Meanwhile, the substrate 212 may be formed of Pyrex glass, quartz, GaAs, or other suitable material. The dielectric thin films 214 may be formed of SiN, $Al_2O_3$, or other suitable material. The piezoelectric thin film 218 may be formed of AlN, PZT, or other suitable material. The electrode thin films 216 may be formed of Au, Ag, or other suitable material.

The electrode thin films 216 are preferably formed to be a square circumscribing a circle having a radius r. The length 2r of one side of this square is preferably about 150 $\mu$m. Also, the thickness t of all layers in the vibrating section is preferably about 1.9 $\mu$m. Thus, the vibration in this preferred embodiment satisfies the condition $r \geq 20t/n$. The electrode thin films 216 are extended to the outside of the vibrating section 220. The shape of the electrode thin film 216 may be substantially circular or a polygon such as a hexagon, octagon, or other suitable shape including a circle satisfying the above condition.

The piezoelectric resonator 210 of this preferred embodiment preferably has a resonance frequency of about 2 GHz. In this preferred embodiment, one resonator 213a and the other resonator 213b are constructed so that they have resonance frequencies shifted from each other by about 4 MHz. Methods for shifting the resonance frequency include changing the thickness of the electrode thin film 216 in one resonator 213a and the other resonator 213b, evaporating (evaporation trimming) a metal such as Ag in the vicinity of the opposing section of the electrode thin films 216 from the rear surface of the resonator 213, and changing the size of the electrode thin films 216, and other methods. If the frequency is shifted by changing the size (area) of the electrode thin films 216, this can be achieved by simply changing the patterns, and the number of electrode forming steps is not required to be increased. Meanwhile, although the amount of shift is not limited to approximately 4 MHz, preferably, in order to achieve the advantages of preferred embodiments of the present invention, with respect to the resonance frequency of one resonator, the resonance frequency of the other resonator preferably has a value that is within ±0.5%.

The piezoelectric resonator 210 of various preferred embodiments of the present invention is manufactured preferably according to the following steps. First, as the dielectric thin film 214, a SiO$_2$ film is formed on the {100} Si substrate by a thermal oxidation, sputtering, or CVD method. As the lower electrode thin film 216, an Al film is formed thereon by an evaporating or sputtering method. Furthermore, as the piezoelectric thin film 218, a ZnO film is formed thereon. Furthermore, as the upper electrode thin film 216, an Al film is formed thereon so as to oppose the lower electrode thin film 216. The ZnO film defining the piezoelectric thin film 218 is, when using a thickness-shear vibration, polarized in the thickness direction, and when using the thickness longitudinal vibration, is polarized in the direction that is substantially. In this preferred embodiment, the ZnO film is polarized in the thickness direction to use the thickness longitudinal vibration. Furthermore, as the dielectric thin film 214, an SiO$_2$ film is preferably formed on the top layer by a sputtering or CVD method or other suitable method. Meanwhile, the substrate 212 in the portion opposite to the electrode thin film 216 and in the region therebelow (vibrating section 220) is removed by a method such as anisotropic etching, RIE, laser treatment, or sandblasting.

Figure 26:
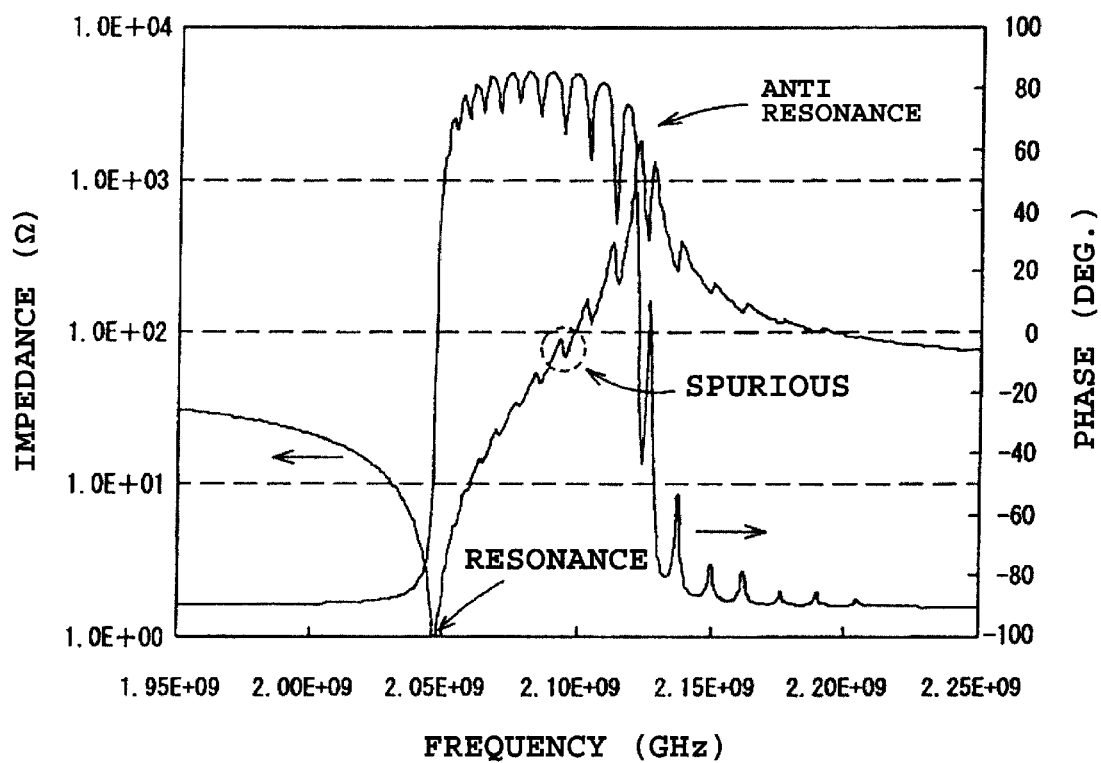
FIG. 26 is a graph showing the impedance characteristic of a single resonator provided with a substantially square electrode having a length of one side of about 150 μm.

FIG. 26 is a graph showing the impedance characteristic of a single resonator 213 in which a square electrode thin film 216, having a length of one side of about 150 μm, is provided, and the laminated structure of the vibrating section 220 and the thickness of each layer are preferably the same as those of the above-described resonator. In this case, spurious vibrations generated by many non-harmonic higher modes can be seen between resonance and anti-resonance frequencies.

Figure 27:
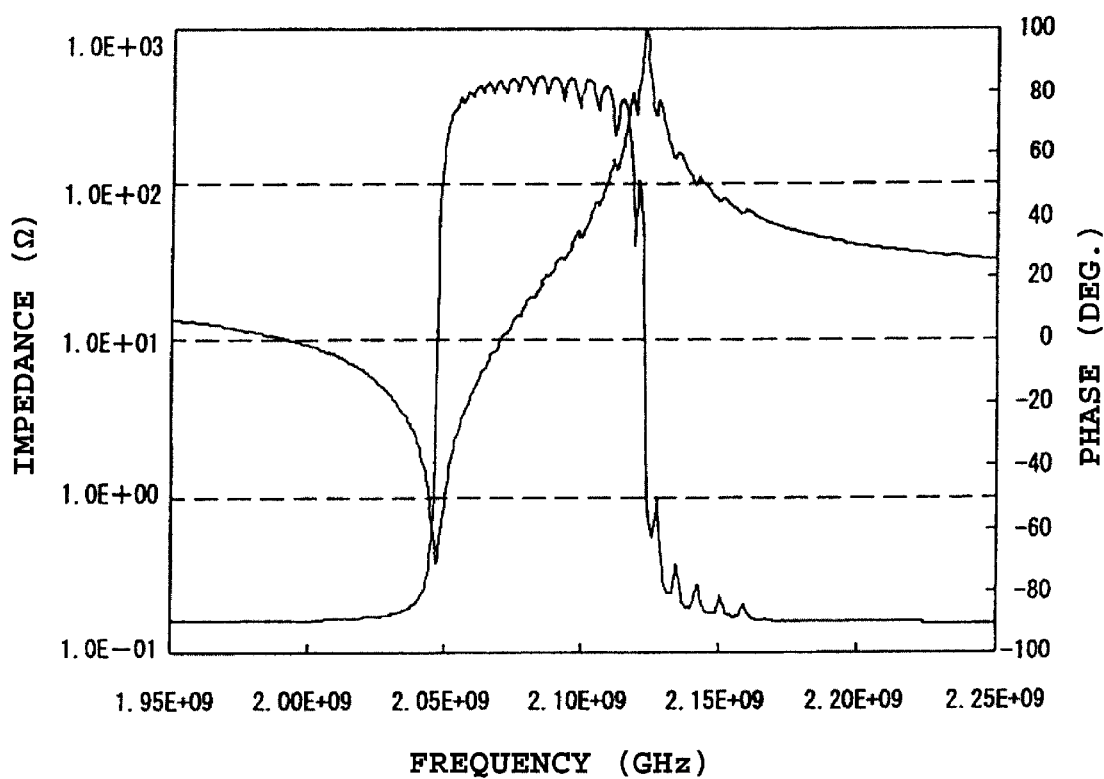
FIG. 27 is a graph showing the impedance characteristic of a single resonator provided with a substantially square electrode having a length of one side of about 230 μm.

FIG. 27 is a graph showing the impedance characteristic of a single resonator 213 in which a square electrode thin film, having a length of one side of about 230 μm, is provided, and the laminated structure of the vibrating section 220 and the thickness of each layer are preferably substantially the same as those of the above-described resonator. In this case, the influence of the spurious vibrations between the resonance and anti-resonance is small. However, in this piezoelectric resonator, as the size of the electrodes increases, the vibrating section becomes difficult to form, and the yield is less than that of this preferred embodiment. Also, the vibrating section may be easily deformed or damaged.

Figure 28:
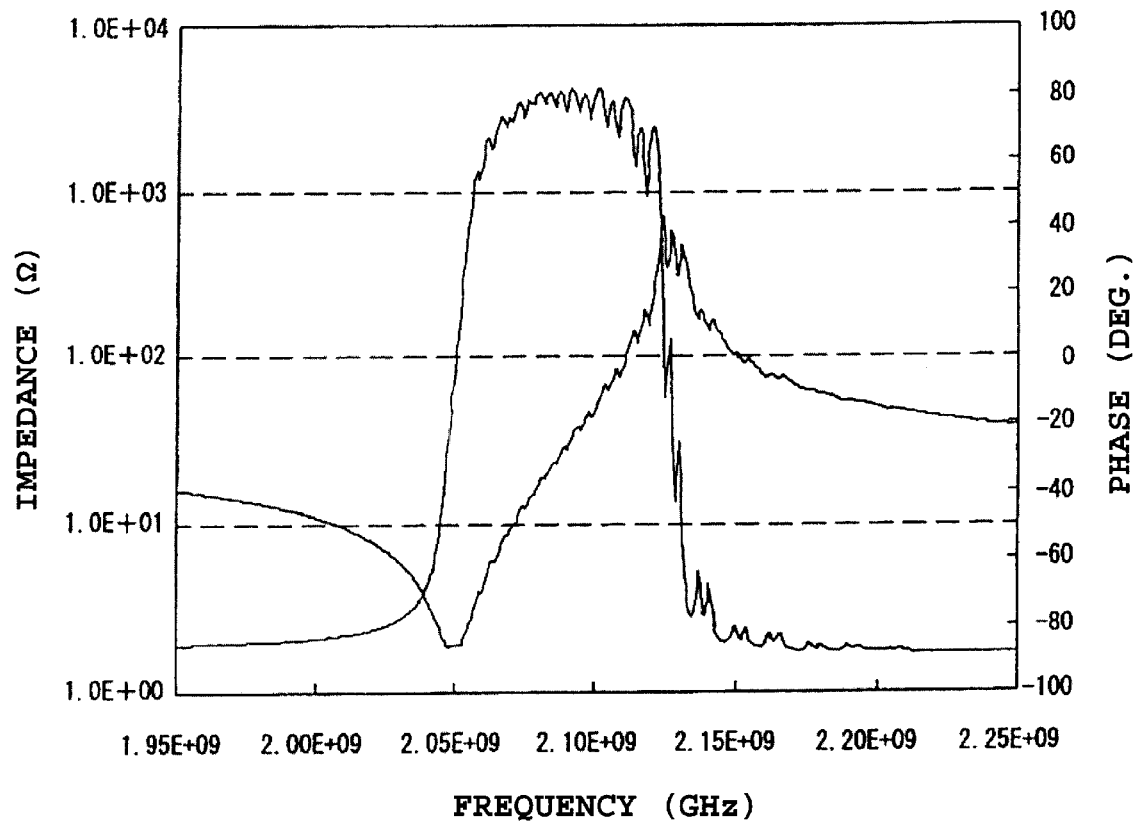
FIG. 28 is a graph showing the impedance characteristic of the piezoelectric resonator shown in FIG. 24.

On the other hand, FIG. 28 is a graph showing the impedance characteristic of the piezoelectric resonator 210 of the present preferred embodiment. As described in FIG. 28, in the piezoelectric resonator 210 of this preferred embodiment, the influence of the spurious vibrations between resonance and anti-resonance is small compared to the device shown in FIG. 26. Moreover, since the size of each vibrating section 220 in the resonators 213a and 213b connected in parallel is smaller than that shown in FIG. 27, the vibrating sections 220 are easily formed, and are prevented from being deformed or damaged.

Figure 29:
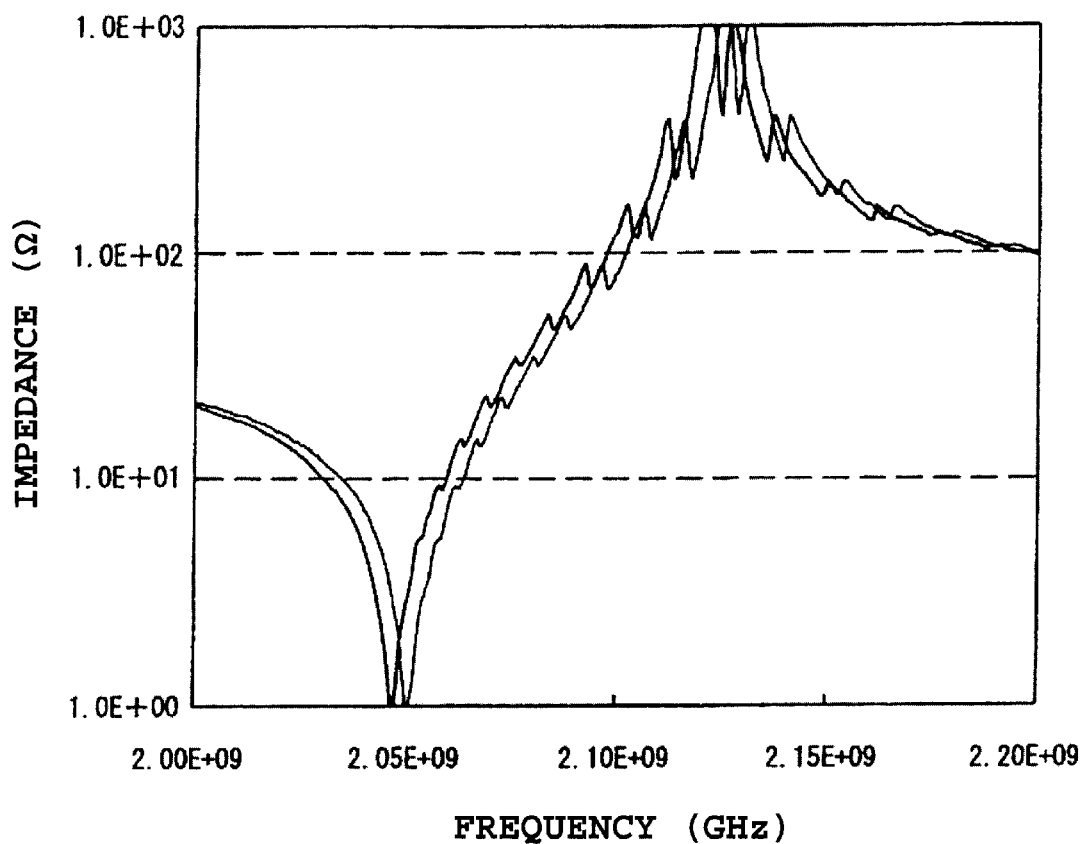
FIG. 29 is a graph integrally showing the impedance characteristic of each of two resonators disposed on a substrate of the piezoelectric resonator according to a preferred embodiment of the present invention.

FIG. 29 is a graph integrally showing the impedance characteristic of each resonator 213a and 213b defining the piezoelectric resonator 210 of this preferred embodiment. Many spurious vibrations due to non-harmonic higher modes occur between resonance and anti-resonance frequencies of each impedance characteristic. Also, there are a sharpened portion due to the influence of the spurious vibrations and a smoothly changing portion in the impedance curve between the resonance and anti-resonance frequencies. By slightly shifting the resonance frequency of one resonator 213a from the resonance frequency of the other resonator 213b (e.g. within about ±0.5%), the sharpened portion in the impedance curve of one resonator 213a can be combined with the smoothly changing portion in the impedance curve of the other resonator 213b. Thus, after being combined, since the sharpened portion is relatively reduced compared to the individual characteristics before being combined, a piezoelectric resonator 210 hardly affected by the spurious vibrations can be obtained. Also, the impedance can be adjusted by connecting a plurality of resonators 213, and thus, the piezoelectric resonator 210 having a desired impedance can be obtained.

Figure 30:
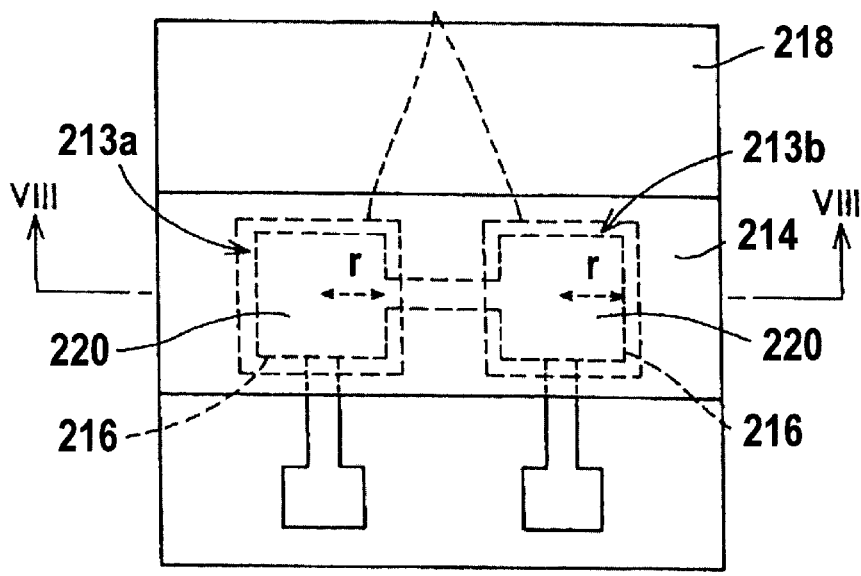
FIG. 30 is a schematic plan view showing another example of the piezoelectric resonator according to third preferred embodiment of the present invention.
Figure 31:
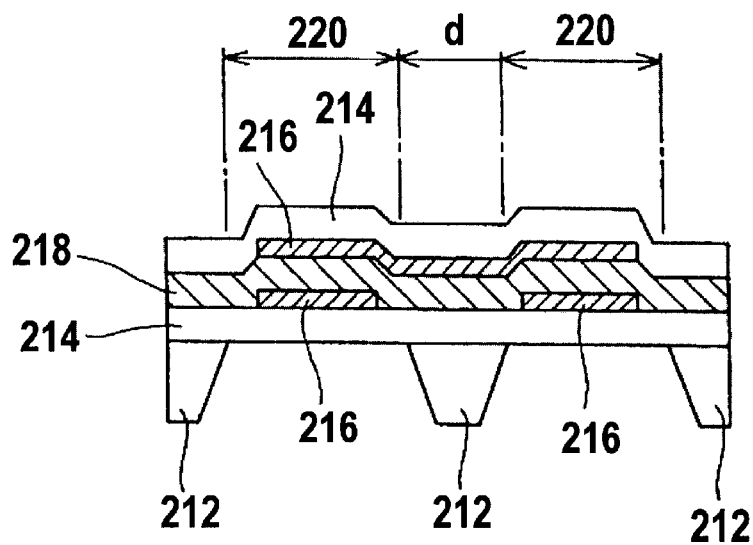
FIG. 31 is a schematic cross-sectional view of the piezoelectric resonator shown in FIG. 31.
Figure 32:
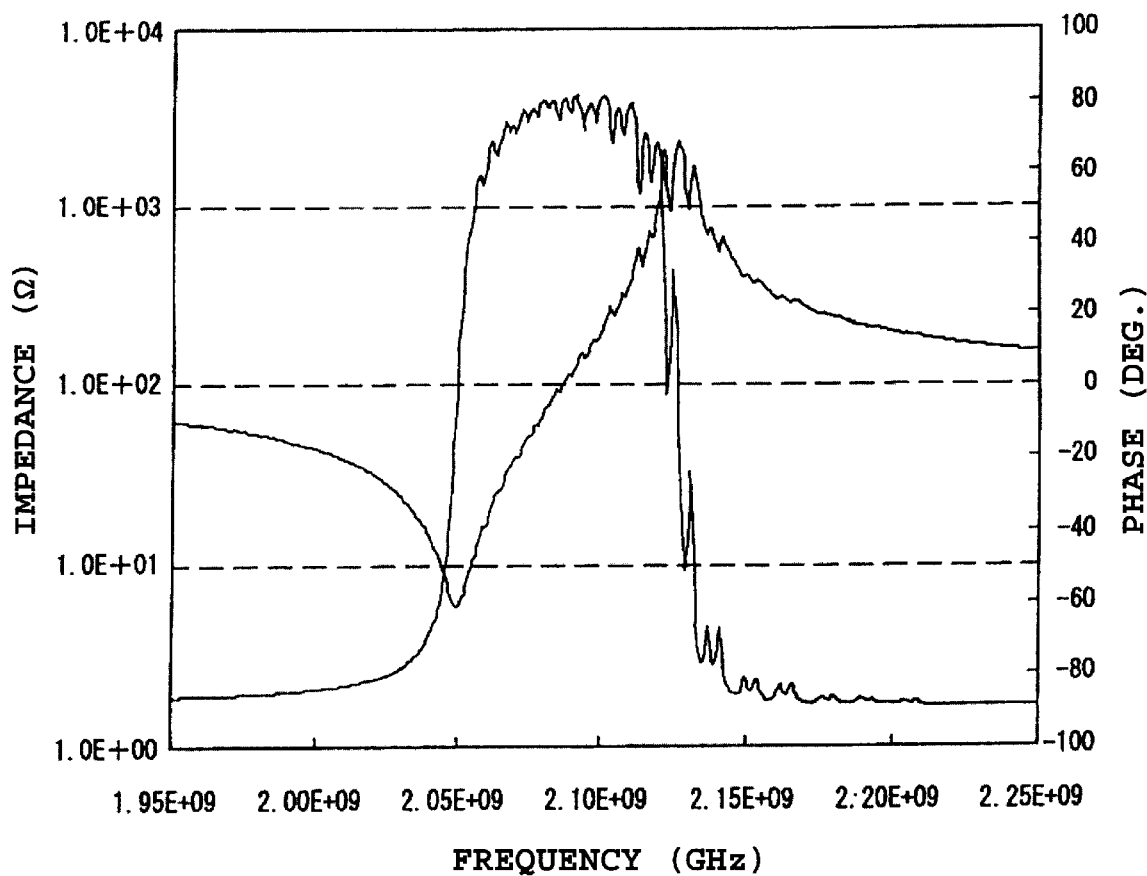
FIG. 32 is a graph showing the impedance characteristic of the piezoelectric resonator shown in FIG. 31.

FIG. 30 is a plan view showing another example of a piezoelectric resonator according to the third preferred embodiment, and FIG. 31 is a schematic cross-sectional view thereof. FIG. 32 is a graph showing the characteristic of the piezoelectric resonator 211 of this preferred embodiment shown in FIG. 31. This piezoelectric resonator 211 differs from the preferred embodiment shown in FIG. 24 in that two resonators 213 and 213 on the substrate 212 are electrically connected in series. As shown in FIG. 32, according to the piezoelectric resonator 210 shown in FIG. 30, the same effect as that of the resonator shown in FIG. 24 can be obtained.

Figure 33:
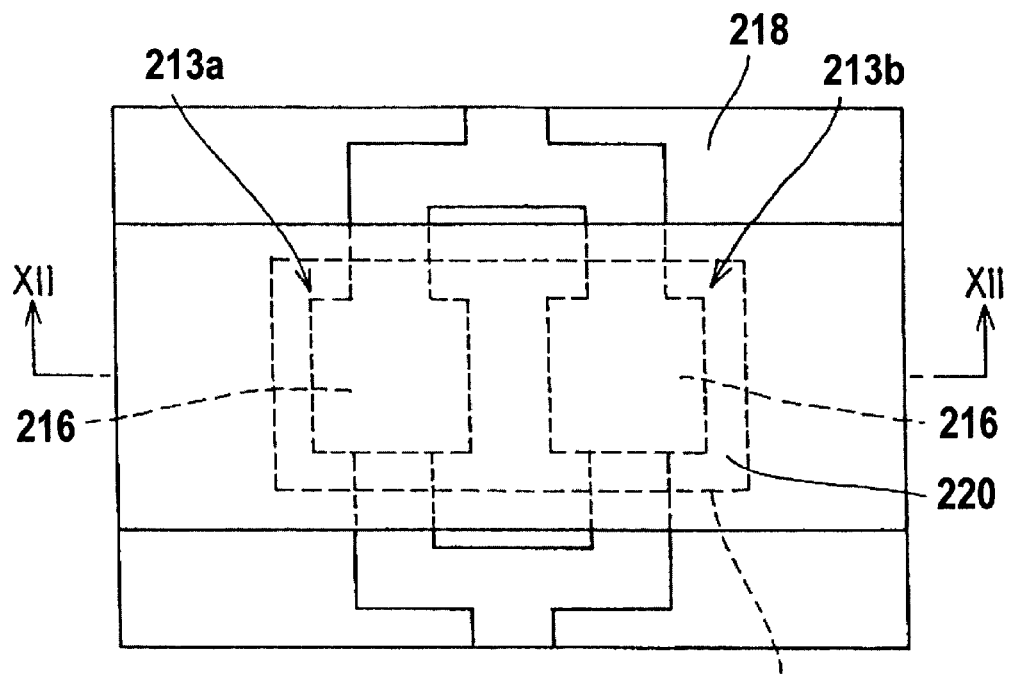
FIG. 33 is a plan view showing still another example of the piezoelectric resonator according to third preferred embodiment of the present invention.
Figure 34:
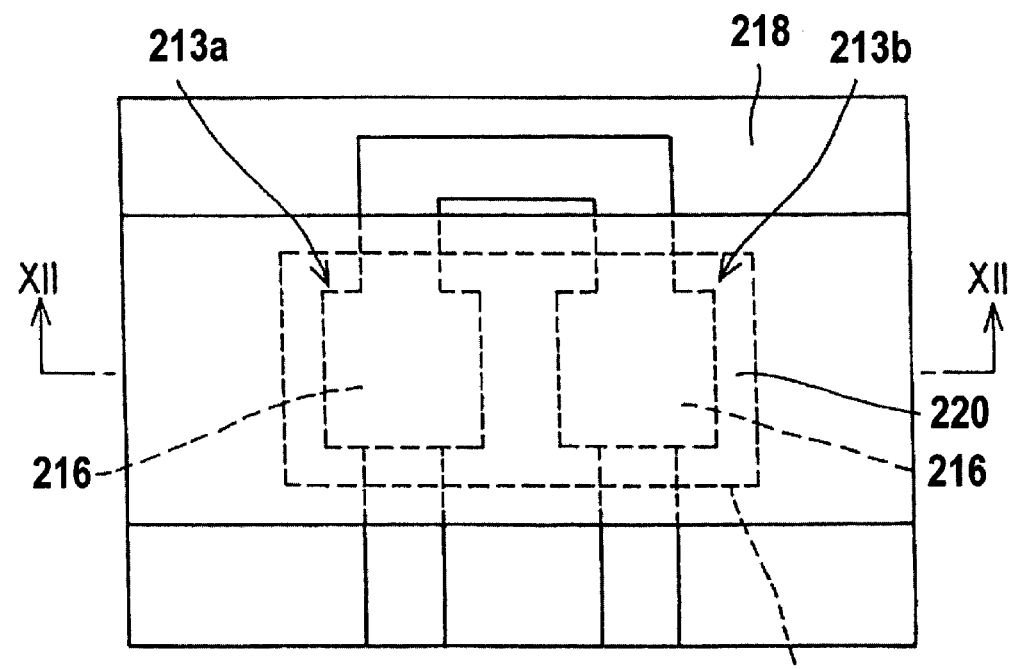
FIG. 34 is a plan view showing still another example of the piezoelectric resonator according to the third preferred embodiment of the present invention.
Figure 35:
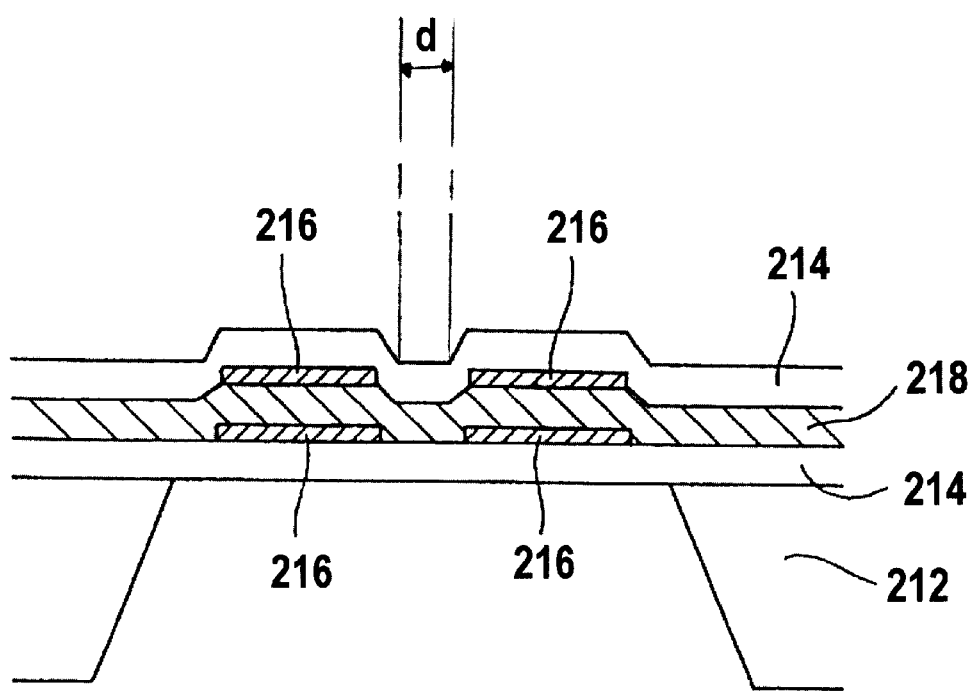
FIG. 35 is a schematic cross-sectional view taken along the line XII—XII in FIG. 34.

FIG. 33 and FIG. 34 are plan views each showing another example of the piezoelectric resonator according to the third preferred embodiment. FIG. 35 is a schematic cross-sectional view through a line XII—XII shown in FIG. 33 or FIG. 34. The piezoelectric resonator shown in FIG. 33 is characterized in that a plurality of resonators 213a and 213b having slightly different resonance frequencies are provided in the same vibrating section 220 having a common diaphragm, and those resonators 213a and 213b are electrically connected in parallel. Also, FIG. 34 is a plan view showing another example of the piezoelectric resonator according to the third preferred embodiment. This piezoelectric resonator is characterized in that a plurality of resonators 213a and 213b having slightly different resonance frequencies are provided on the same vibrating section 220 having a common diaphragm, and the resonators 213a and 213b are electrically connected in series. The same effect as that described above can be obtained by these piezoelectric resonators.

Furthermore, the piezoelectric resonator of this preferred embodiment is constructed so that the distances d between the resonator 213a of the vibrating section 220 and the resonator 213b of the vibrating section 220 is about ½ of the wavelength of a resonance frequency. Thereby, deterioration in the characteristic such as the generation of spurious responses due to mutual influence of two resonators 213a and 213b can be prevented. Also, by setting the distance d to about ½ of the vibration wave, the resonators can be connected in series or in parallel with a minimum space, and the device can have a very small size. It is sufficient that the distance d is about ½ or more times the vibration wave.

Figure 36:
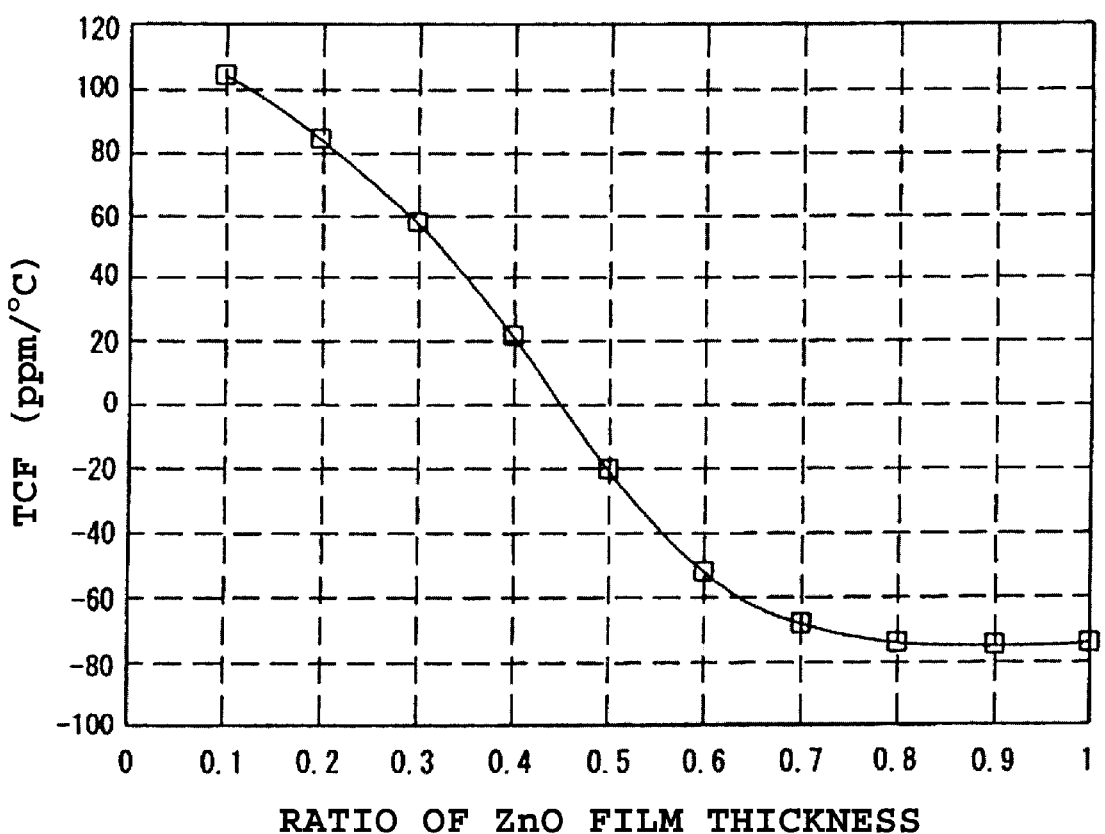
FIG. 36 is a graph showing the relationship between the ratio of ZnO film thickness and TCF regarding a fundamental wave of the piezoelectric resonator according to a preferred embodiment of the present invention.

FIG. 36 is a graph showing the relationship between the ratio of ZnO film thickness (ZnO film thickness/total film thickness of ZnO and SiO$_2$ in the vibrating section) and the temperature coefficient of resonance frequency (hereinafter referred to as TCF: Temperature Coefficient of Frequency). Since the temperature coefficient of elastic constant of SiO$_2$ is positive while the temperature coefficient of elastic constant of ZnO is negative, by combining them at an appropriate ratio, a piezoelectric resonator having a resonance frequency of zero such that a resonance frequency does not change with changes in temperature, can be obtained.

Figure 37:
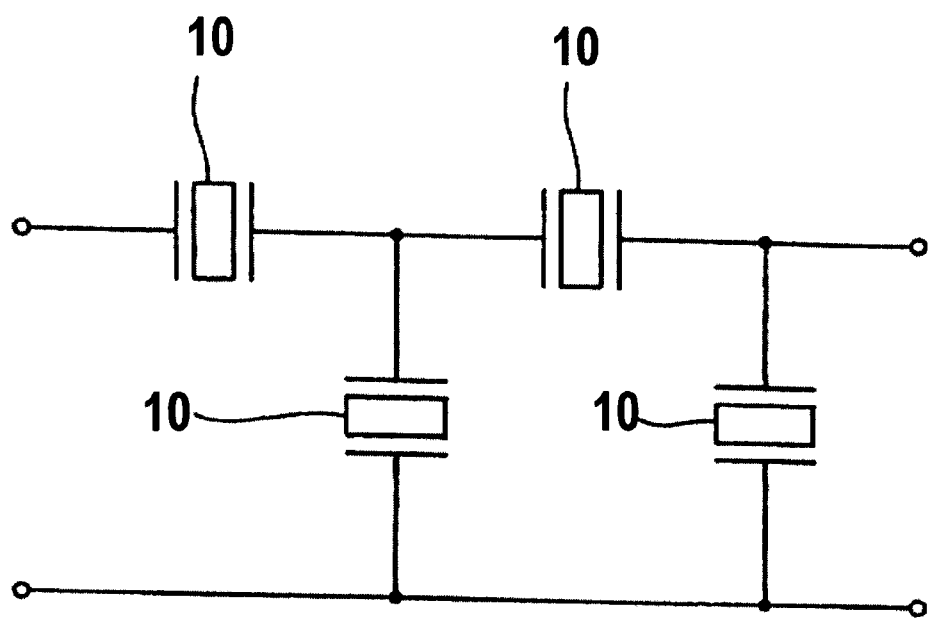
FIG. 37 is an equivalent circuit diagram showing a ladder-type filter in which the piezoelectric resonators according to various preferred embodiments of the present invention are combined.

For example, in the piezoelectric resonator, by adjusting the thickness of each layer in the vibrating section 220 to achieve a ratio of film thickness of the ZnO film of about 45%, as shown in FIG. 36, TCF can be zero. Thus, a piezoelectric resonator or a filter having a stable frequency characteristic with respect to temperature can be obtained. An equivalent circuit diagram of a filter 230 in which piezoelectric resonators according to the third preferred embodiment are combined is shown in FIG. 37. Meanwhile, although FIG. 37 shows an example of an L-type filter, a T-type or π-type ladder filter may be constructed to include the piezoelectric resonator according to various preferred embodiments of the present invention.

Meanwhile, in each of the preferred embodiments of the present invention described above, although two resonators 213*a* and 213*b* are preferably provided on one substrate 212, many more resonators may be formed and they may be connected in parallel or in series. Also, a plurality of devices having the resonators disposed on one substrate 212 may be connected in series or in parallel by a wire bonding method or other suitable method to form one piezoelectric resonator. Also, a plurality pairs of electrode thin films 216 may be laminated on the same vibrating section 220 in the thickness direction, and the electrode thin films 216 may be connected in series or in parallel to define a piezoelectric resonator.

As explained above, according to the third preferred embodiment, by connecting a plurality of resonators provided with comparatively small electrodes which are easily produced and have good durability in series or in parallel so that the resonance frequency is slightly shifted, a piezoelectric resonator having a spurious vibration suppression effect identical to that of a single resonator provided with large electrodes can be obtained.

Also, by connecting a plurality of the resonators having resonance frequencies that are slightly shifted in series or in parallel, the impedance can be adjusted while improving the spurious characteristic. More specifically, according to preferred embodiments of the present invention, a piezoelectric resonator that is not affected by spurious vibrations and having a desired impedance can be obtained.

Furthermore, by allowing the temperature coefficient of the elastic constants of the piezoelectric body and the dielectric body defining the vibrating section to have opposite signs relative to each other and by combining them at an appropriate ratio of film thickness, the TCF can be zero. Thereby, a piezoelectric resonator which has a stable resonance frequency with respect to changes in temperature and in which spurious vibrations are suppressed can be obtained.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A piezoelectric resonator using an $n^{th}$-order mode of a thickness longitudinal vibration or a thickness-shear vibration comprising:
    a vibrating section including a piezoelectric layer;
    a pair of electrodes provided on opposite sides of the piezoelectric layer, respectively, each of the pair of electrodes includes a portion in the vibrating section having substantially the same shape, the pair of electrodes partially overlapping with each other in the vibrating section via the piezoelectric layer to define an opposite electrode portion; and
    a support member arranged to hold the vibrating section such that the vibrating section vibrates according to an $n^{th}$-order mode of the thickness longitudinal vibration or the thickness-shear vibration;
    wherein the portion of each of the pair of electrodes in the vibrating section has one of a substantially circular shape having a radius r and a polygonal shape circumscribing a substantially circular shape having a radius r, and the radius r satisfies the following inequality:

$$20t/n \leq r$$

where t is a thickness of the vibrating section.

2. The piezoelectric resonator according to claim 1, wherein a mechanical quality coefficient of the piezoelectric resonator is about 1000 or more, and the radius r of the substantially circular shape satisfies the following inequality:

$$40t/n \leq r.$$

3. The piezoelectric resonator according to claim 1, wherein a mechanical quality coefficient of the piezoelectric resonator is less than about 1000, and the radius r of the substantially circular shape satisfies the following inequality:

$$20t/n \leq r < 40.$$

4. The piezoelectric resonator according claim 1, wherein the vibrating section further includes a dielectric layer, and temperature coefficients of elastic constant of the piezoelectric layer and the dielectric layer have polarities that are different from each other.

5. The piezoelectric resonator according claim 1, wherein the vibrating section includes another piezoelectric layer, and temperature coefficients of elastic constant of the two piezoelectric layers have polarities that are different from each other.

6. The piezoelectric resonator according claim 1, wherein a shortest distance x from an end of the opposite electrode portion to an end of the region where the support member holds the vibrating section satisfies the following inequality:

$$2t/n \leq x \leq 10t.$$

7. The piezoelectric resonator according to claim 6, wherein the region where the support member holds the vibrating section encircles the opposite electrode portion.

8. The piezoelectric resonator according to claim 1, wherein the shape of the opposite electrode portion is one of a square circumscribing the substantially circular shape, a hexagon circumscribing the substantially circular shape, and an octagon circumscribing the substantially circular shape.

9. The piezoelectric resonator according to claim 1, wherein the two opposing electrodes extend to opposite ends of the vibrating section.

10. The piezoelectric resonator according to claim 1, wherein the vibrating section includes a first layer including a piezoelectric body made of ZnO and a dielectric body made of $SiO_2$.

11. The piezoelectric resonator according to claim 10, wherein the temperature coefficient of elastic constant of the $SiO_2$ has a positive value and a temperature coefficient of elastic constant of the ZnO has a negative value.

12. The piezoelectric resonator according to claim 1, wherein the piezoelectric resonator has a TCF of zero.

13. A piezoelectric filter comprising a plurality of the piezoelectric resonators according to claim 1, the plurality of the piezoelectric resonator being connected to define a filter circuit.

14. A piezoelectric resonator comprising first and second piezoelectric resonator elements using an $n^{th}$-order mode of a thickness longitudinal vibration or a thickness-shear vibration, each of the first and second piezoelectric resonator elements comprising:

a vibrating section including a piezoelectric layer;

a pair of electrodes provided on opposite sides of the piezoelectric layer, respectively, the pair of electrodes partially overlapping with each other via the piezoelectric layer to define an opposite electrode portion; and a support member arranged to hold the vibrating section such that the vibrating section vibrates according to an $n^{th}$-order mode of the thickness longitudinal vibration or the thickness-shear vibration;

wherein the opposite electrode portion has one of a substantially circular shape having a radius r and a polygonal shape circumscribing a substantially circular shape having a radius r, and the radius r satisfies the following inequality:

$$20t/n \leq r$$

where t is a thickness of the vibrating section;
wherein the first and second piezoelectric resonator elements are electrically connected in one of parallel and series, and have different resonant frequencies from each other.

15. The piezoelectric resonator according to claim 14, wherein the resonant frequencies of the first and second piezoelectric resonator elements are different from each other by about 0.5%.

16. The piezoelectric resonator according to claim 14, wherein the vibrating section of the first piezoelectric resonator element is spaced from the vibrating section of the second piezoelectric resonator element by a distance that is substantially equal to or greater than one half wavelength of the resonant frequency of the first piezoelectric resonator element.

17. The piezoelectric resonator according to claim 14, wherein a size of the opposite electrode portion of the first piezoelectric resonator element is different from that of the second piezoelectric resonator element.

18. The piezoelectric resonator according to claim 14, wherein the piezoelectric resonator has a TCF of zero.

19. The piezoelectric resonator according to claim 14, wherein the piezoelectric layers of the first and second piezoelectric resonators are integral with each other.

20. A piezoelectric filter comprising a plurality of the piezoelectric resonators according to claim 14, the plurality of the piezoelectric resonator being connected to define a filter circuit.

* * * * *